US012799020B2

(12) United States Patent
Lanagan et al.

(10) Patent No.: US 12,799,020 B2
(45) Date of Patent: Nov. 17, 2026

(54) DEVICE COMPRISING A LOW DIELECTRIC LOSS BOROSILICATE GLASS SUBSTRATE AND METHODS OF MAKING THE SAME

(71) Applicant: THE PENN STATE RESEARCH FOUNDATION, University Park, PA (US)

(72) Inventors: Michael T. Lanagan, University Park, PA (US); Rocio Rodriguez-Cano, University Park, PA (US); Nicholas L. Clark, University Park, PA (US); John C. Mauro, University Park, PA (US)

(73) Assignee: The Penn State Research Foundation, University Park (PA)

( * ) Notice: Subject to any disclaimer, the term of this patent is extended or adjusted under 35 U.S.C. 154(b) by 220 days.

(21) Appl. No.: 18/668,413

(22) Filed: May 20, 2024

(65) Prior Publication Data

US 2024/0400438 A1 Dec. 5, 2024

Related U.S. Application Data

(60) Provisional application No. 63/505,101, filed on May 31, 2023.

(51) Int. Cl.
*C03C 4/16* (2006.01)
*C03C 10/00* (2006.01)
(Continued)

(52) U.S. Cl.
CPC ............ *C03C 4/16* (2013.01); *C03C 10/0009* (2013.01); *C03C 10/0054* (2013.01);
(Continued)

(58) Field of Classification Search
CPC ............... Y10T 428/25; Y10T 428/252; Y10T 428/31601; Y10S 428/901; B32B 5/00;
(Continued)

(56) References Cited

U.S. PATENT DOCUMENTS

2023/0093194 A1* 3/2023 Ogawa .................... C03B 32/00 428/131
2023/0348317 A1* 11/2023 Suzuki .................... C03C 3/091

FOREIGN PATENT DOCUMENTS

WO WO-2021246345 A1 * 12/2021 ............ C03B 32/00
WO WO-2022054694 A1 * 3/2022 ............... C03C 4/16

OTHER PUBLICATIONS

Wang, Lu, et al. "Progress on polymer composites with low dielectric constant and low dielectric loss for high-frequency signal transmission." Frontiers in Materials 8 (2021): 774843.
(Continued)

*Primary Examiner* — Maria V Ewald
*Assistant Examiner* — Ethan A. Utt
(74) *Attorney, Agent, or Firm* — Meunier Carlin & Curfman LLC

(57) ABSTRACT

Disclosed herein is a device comprising: a glass substrate comprising a glass composition comprising $xB_2O_3$-$ySiO_2$-$zM_2O$, wherein $10 \leq x < 100$ by mol %; wherein $0 < y < 90$ by mol %; wherein M is an alkali metal and wherein $0 \leq z \leq 10$ by mol %, wherein the glass forms a structure comprising two or more immiscible phases, wherein the glass substrate has a dielectric constant lower than 6, and wherein the glass substrate has a dielectric loss tangent equal to or less than $1 \times 10{-}2$ in a frequency range from 1 GHz to 1 THz.

19 Claims, 5 Drawing Sheets

(51) Int. Cl.
*C04B 37/04* (2006.01)
*H05K 1/03* (2006.01)

(52) U.S. Cl.
CPC .......... *C04B 37/04* (2013.01); *H05K 1/0306* (2013.01); *C03C 2204/00* (2013.01)

(58) Field of Classification Search
CPC .......... B32B 5/14; B32B 5/145; B32B 17/00; B32B 17/06; B32B 17/061; B32B 17/10; B32B 2307/204; B32B 2457/08; C03C 3/00; C03C 3/04; C03C 3/06; C03C 3/062; C03C 3/064; C03C 3/076; C03C 3/083; C03C 3/085; C03C 3/087; C03C 3/089; C03C 3/091; C03C 3/11; C03C 4/00; C03C 4/16; C03C 17/00; C03C 17/06; C03C 17/22; C03C 17/23; C03C 17/28; C03C 17/32; C03C 2201/00; C03C 2204/00; C03C 2217/00; C03C 2217/20; C03C 2217/21; C03C 2217/25
USPC .... 428/323, 325, 425.6, 426, 432, 433, 901; 501/2, 11, 53, 54, 55, 56, 65, 66, 68, 69, 501/70, 72
See application file for complete search history.

(56) References Cited

OTHER PUBLICATIONS

Cho, C-C., D. M. Smith, and J. Anderson. "Low dielectric-constant insulators for electronics applications." Materials chemistry and physics 42.2 (1995): 91-95.
Yu, Tian, et al. "Developing of wafer level fan-out packaging technology for millimeter-wave chip using different carriers." 2019 IEEE International Conference on Integrated Circuits, Technologies and Applications (ICTA). IEEE, 2019.
Shorey, Aric, et al. "Development of substrates for through glass vias (TGV) for 3DS-IC integration." 2012 IEEE 62nd Electronic Components and Technology Conference. IEEE, 2012.
Levy, David H., et al. "Enabling low loss thin glass solutions for 5G/mmWave applications." 2021 IEEE 71st Electronic Components and Technology Conference (ECTC). IEEE, 2021.
Sivapurapu, Sridhar, et al. "Flexible and ultra-thin glass substrates for RF applications." 2021 IEEE 71st Electronic Components and Technology Conference (ECTC). IEEE, 2021.
Tostanoski, Nicholas J., et al. "Structure-terahertz property relationship in sodium borosilicate glasses." International Journal of Applied Glass Science 14.2 (2023): 288-306.
Lanagan, Michael T., et al. "Dielectric polarizability of alkali and alkaline-earth modified silicate glasses at microwave frequency." Applied Physics Letters 116.22 (2020).
Shannon, Robert D. "Dielectric polarizabilities of ions in oxides and fluorides." Journal of Applied physics 73.1 (1993): 348-366.
Charles, R. J., and F. E. Wagstaff. "Metastable immiscibility in the B2O3—SiO2 system." Journal of the American Ceramic Society 51.1 (1968): 16-20.
Rodriguez-Cano, Rocio, et al. "Broadband characterization of silicate materials for potential 5g/6g applications." IEEE Transactions on Instrumentation and Measurement 72 (2023): 1-8.
Van Uitert, L. G., et al. "Borosilicate glasses for fiber optical waveguides." Materials Research Bulletin 8.4 (1973): 469-476.
Cai, Ling, et al. "Glass for 5G applications." Applied Physics Letters 119.8 (2021), 082901.
I. Shott, Glass Antennas for High-Frequency Applications, 2023.
Letz, M., et al. "Special glass for packaging of high frequency electronics." 2021 51st European Microwave Conference (EuMC). IEEE, 2022.
Xing, Yunchou, and Theodore S. Rappaport. "Propagation measurement system and approach at 140 GHz-moving to 6G and above 100 GHz." 2018 IEEE global communications Conference (GLOBECOM). IEEE, 2018.
Wakino, et al. "Far infrared reflection spectra of Ba (Zn, Ta) O3—BaZrO3 dielectric resonator material." Journal of the American Ceramic Society 69.1 (1986): 34-37.
Sheen, Jyh. "Study of microwave dielectric properties measurements by various resonance techniques." Measurement 37.2 (2005): 123-130.
Lanagan, Michael T., et al. "High frequency dielectric materials for medicine and telecommunications." Japanese Journal of Applied Physics 60.SF (2021): SF0801.
Swaminathan, Madhavan, et al. "Materials for heterogeneous integration." MRS Bulletin 46.10 (2021): 967-977.
Ravichandran, Siddharth, et al. "Packaging approaches for mm wave and sub-THz communication." 2019 IEEE MTT-S International Microwave Conference on Hardware and Systems for 5G and Beyond (IMC-5G). IEEE, 2019.
Jia, Xiaofan, et al. "Die-embedded glass packaging for 6G wireless applications." MRS Advances 7.29 (2022): 630-634.
Lanagan, Michael T., et al. "Dielectric polarizability of alkali and alkaline-earth modified silicate glasses at microwave frequency." Applied Physics Letters 116.22 (2020), 222902.
Nordberg, Martin E. "Properties of some Vycor-brand glasses." Journal of the American Ceramic Society 27.10 (1944): 299-305.
Watanabe, Atom O., et al. "A review of 5G front-end systems package integration." IEEE Transactions on Components, Packaging and Manufacturing Technology 11.1 (2020): 118-133.
Rodriguez-Cano, Rocio, and Michael Lanagan. "Wideband All-Dielectric Reflector at 100 GHz for 6G Communications." 2023 IEEE International Symposium on Antennas and Propagation and USNC-URSI Radio Science Meeting (USNC-URSI). IEEE, 2023.
Rodriguez-Canoa,et al.,Borosilicate Glass with Dielectric Low Loss and Low Permittivity for 5G/6G Electronic Packaging Applications. Journal of the American Ceramic Society 00 (2024) 1-6.
Li, Lei, et al. "B2O3-modified fused silica microwave dielectric materials with ultra-low dielectric constant." Journal of the European Ceramic Society 35.6 (2015): 1799-1805.
Furukawa, Toshiharu, and William B. White. "Raman spectroscopy of heat-treated B2O3—SiO2 glasses." Journal of the American Ceramic Society 64.8 (1981): 443-447.

* cited by examiner wi

DEVICE COMPRISING A LOW DIELECTRIC LOSS BOROSILICATE GLASS SUBSTRATE AND METHODS OF MAKING THE SAME

CROSS-REFERENCE TO THE RELATED APPLICATIONS

This application claims the benefit of U.S. Provisional Application No. 63/505,101, filed May 31, 2023, the content of which is incorporated herein by reference in its entirety.

STATEMENT ACKNOWLEDGING GOVERNMENT SUPPORT

This invention was made with government support under Grant Nos. IIP1841453 and IIP1841466 awarded by the National Science Foundation, as part of the Center for Dielectrics and Piezoelectrics. The Government has certain rights in the invention.

TECHNICAL FIELD

The present invention generally relates to devices comprising low dielectric loss borosilicate substrates and methods of making the same.

BACKGROUND

Including new frequency bands in the millimeter-wave (mm-wave) spectrum for 5G communications has renewed interest in low-loss, low-permittivity materials for antenna, electronic packaging, and radome applications. A lower dielectric constant allows higher signal propagation speeds, as the propagation speed of electromagnetic waves is inversely proportional to the dielectric constant. A substrate with a lower dielectric constant also provides less capacitive crosstalk between neighboring conductors since the coupling between the traces or vias is smaller. Glass is a promising candidate for a substrate capable of reducing the propagation loss of semiconductor chip interposers in integrated circuits due to its low loss, low manufacturing cost, and high signal.

Fused silica has exceptionally low dielectric constant and loss among glasses in the silicate family. However, its high melting point of 1715° C. and processing temperatures of more than 2000° C. make it costly to manufacture. Hence, most silicate glasses incorporate relatively high concentrations of alkali (Li, Na, and K) and alkaline-earth additives (Mg, Ca, Sr, and Ba) to reduce the melting point, making manufacturing more affordable. However, these additives have been found to increase both the dielectric constant and loss tangent because of higher ionic polarizability.

Thus, low dielectric constant and low tandem loss glass substrates are still needed. These needs and other needs are at least partially satisfied by the present disclosure.

SUMMARY

The present invention is directed to a device comprising: a glass substrate comprising a glass composition comprising $xB_2O_3$-$ySiO_2$-$zM_2O$, wherein $10 \leq x < 100$ by mol %; wherein $0 < y < 90$ by mol %; wherein M is an alkali metal and wherein $0 \leq z \leq 10$ by mol %, wherein the glass forms a structure comprising two or more immiscible phases, wherein the glass substrate has a dielectric constant lower than 6, and wherein the glass substrate has a dielectric loss tangent equal to or less than 1×10−2 in a frequency range from 1 GHz to 1 THz; and wherein the glass structure is substantially free of porosity.

While yet in other aspects, when the disclosed herein device comprises a discrete component, an integrated passive device, an antenna, an RF bridge, a diode sub-mount, a fiber alignment, a filter, a resonator, a capacitor, an inductor, a resistor, a substrate integrated waveguide device, an interposer, an electronic packaging, a semiconductor, microprocessor, mm-wave integrated circuit, metasurface, or any combination thereof.

Also disclosed herein is a glass-bonded ceramic comprising: a glass composition comprising $xB_2O_3$-$ySiO_2$-$zM_2O$, wherein $10 \leq x < 100$ by mol %; wherein $0 < y < 90$ by mol %; wherein M is an alkali metal and wherein $0 \leq z \leq 10$ by mol %, and one or more of aluminum oxide, aluminum nitride, silicon carbide, silicon nitride, or silicate minerals, wherein the glass-bonded ceramic has a dielectric loss tangent equal to or less than 1×10−2 in a frequency range from 1 GHz to 1 THz.

Also disclosed herein are methods comprising: (a) forming a mixture comprising $xB_2O_3$-$ySiO_2$-$zM_2O$, wherein $10 \leq x < 100$ by mol % wherein $0 < y < 90$ by mol %; wherein M is an alkali metal and wherein $0 \leq z \leq 10$ by mol % (b) melting the mixture to form a molten liquid, and cooling the molten liquid to form a glass substrate.

Also disclosed herein are methods comprising: (a) forming a first mixture comprising $xB_2O_3$-$ySiO_2$-$zM_2O$, wherein $10 \leq x < 100$ by mol %, wherein $0 < y < 90$ by mol %; wherein M is an alkali metal and wherein $0 \leq z \leq 10$ by mol %; (b) mixing the first mixture with one or more of aluminum oxide, aluminum nitride, silicon carbide, silicon nitride, or silicate minerals to form a second mixture; and (c) forming a glass-bonded ceramic.

Additional aspects of the disclosure will be set forth, in part, in the detailed description, figures, and claims which follow, and in part will be derived from the detailed description, or can be learned by practice of the invention. It is to be understood that both the foregoing general description and the following detailed description are exemplary and explanatory only and are not restrictive of the invention as disclosed.

BRIEF DESCRIPTION OF DRAWINGS

FIG. 1A depicts a dielectric constant. FIG. 1B depicts a dielectric loss tangent. An exemplary glass substrate comprises a glass structure of 33 mol % $B_2O_3$-67 mol % $SiO_2$ in one aspect.

FIGS. 2A-2B show as obtained glass. FIGS. 2C-2F show EDX measurements.

DETAILED DESCRIPTION

Figure 1A:
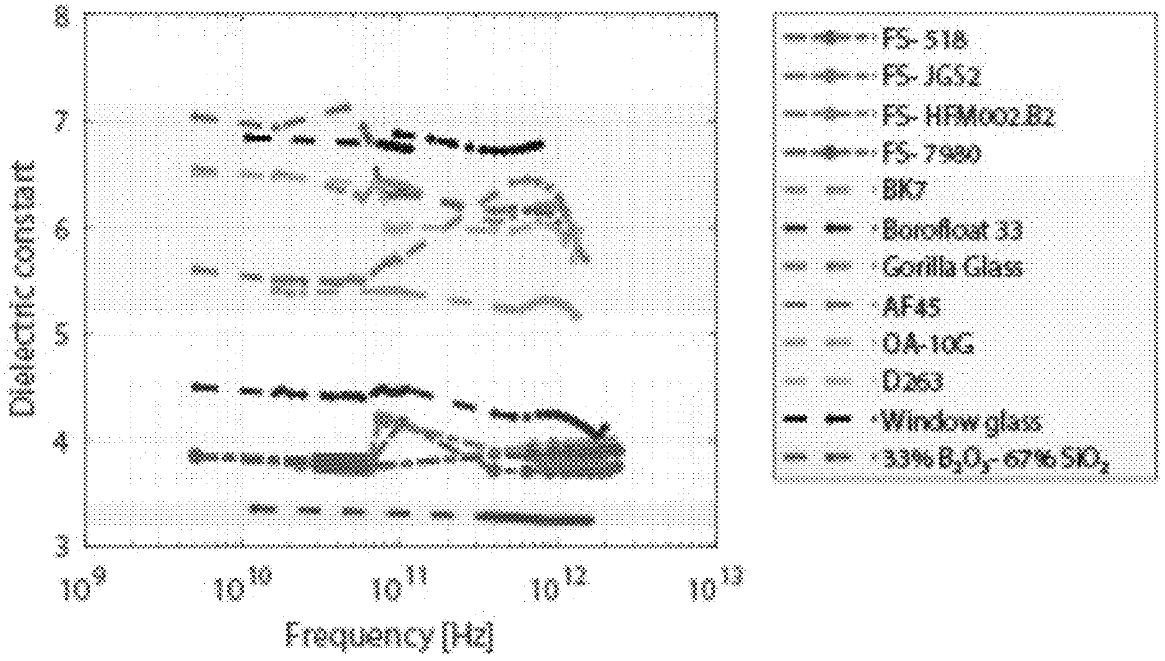
FIGS. 1A-1B depict a comparison of different materials in the silicate family. Crystalline silicates are shaded in red, fused silicas in yellow, and glasses in blue.

The present invention can be understood more readily by reference to the following detailed description, examples, drawings, and claims, and their previous and following description. However, before the present articles, systems, and/or methods are disclosed and described, it is to be understood that this invention is not limited to the specific or exemplary aspects of articles, systems, and/or methods disclosed unless otherwise specified, as such can, of course, vary. It is also to be understood that the terminology used herein is for the purpose of describing particular aspects only and is not intended to be limiting.

The following description of the invention is provided as an enabling teaching of the invention in its best, currently known aspect. To this end, those skilled in the relevant art will recognize and appreciate that many changes can be made to the various aspects of the invention described herein while still obtaining the beneficial results of the present invention. It will also be apparent that some of the desired benefits of the present invention can be obtained by selecting some of the features of the present invention without utilizing other features. Accordingly, those of ordinary skill in the pertinent art will recognize that many modifications and adaptations to the present invention are possible and may even be desirable in certain circumstances and are a part of the present invention. Thus, the following description is again provided as illustrative of the principles of the present invention and not in limitation thereof.

Definitions

As used herein, the terms "optional" or "optionally" mean that the subsequently described event or circumstance can or cannot occur and that the description includes instances where said event or circumstance occurs and instances where it does not.

It is appreciated that certain features of the disclosure, which are, for clarity, described in the context of separate aspects, can also be provided in combination in a single aspect. Conversely, various features of the disclosure, which are, for brevity, described in the context of a single aspect, can also be provided separately or in any suitable subcombination.

As used herein, the singular forms "a," "an," and "the" include plural referents unless the context clearly dictates otherwise. Thus, for example, reference to a "device" includes aspects having two or more such devices unless the context clearly indicates otherwise.

It is also to be understood that the terminology used herein is for the purpose of describing particular aspects only and is not intended to be limiting. As used in the specification and in the claims, the term "comprising" can include the aspects "consisting of" and "consisting essentially of." Unless defined otherwise, all technical and scientific terms used herein have the same meaning as commonly understood by one of ordinary skill in the art to which this invention belongs. In this specification and in the claims which follow, reference will be made to a number of terms that shall be defined herein.

For the terms "for example" and "such as," and grammatical equivalences thereof, the phrase "and without limitation" is understood to follow unless explicitly stated otherwise. It is further understood that these phrases are used for explanatory purposes only. It is further understood that the term "exemplary," as used herein, means "an example of" and is not intended to convey an indication of a preferred or ideal aspect.

The expressions "ambient temperature" and "room temperature" as used herein are understood in the art and refer generally to a temperature from about 20° C. to about 35° C.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Furthermore, when numerical ranges of varying scope are set forth herein, it is contemplated that any combination of these values, inclusive of the recited values, may be used. Further, ranges can be expressed herein as from "about" one particular value and/or to "about" another particular value. When such a range is expressed, another aspect includes from the one particular value and/or to the other particular value.

Similarly, when values are expressed as approximations, by use of the antecedent "about," it will be understood that the particular value forms another aspect. It will be further understood that the endpoints of each of the ranges are significant both in relation to the other endpoint and independently of the other endpoint. Unless stated otherwise, the term "about" means within 5% (e.g., within 2% or 1%) of the particular value modified by the term "about."

All disclosed values also include values that fall within ±10% variation from the disclosed value unless otherwise indicated or inferred. In other words, if a range of 1 to 10 is disclosed, then a range of about 1 to about 10 is disclosed. In such aspects, it is understood that the amount or value in question can be the exact value or a value that provides equivalent results or effects as recited in the claims or taught herein. That is, amounts, sizes, formulations, parameters, and other quantities and characteristics include both exact values but also approximate, larger or smaller values as desired, reflecting tolerances, conversion factors, rounding, measurement error, and the like, and other factors known to those of skill in the art such that equivalent results or effects are obtained. In some circumstances, the value that provides equivalent results or effects cannot be reasonably determined. In general, an amount, size, formulation, parameter, or other quantity or characteristic is "about," "approximate," or "at or about," whether or not expressly stated to be such. Where "about," "approximate," or "at or about" is used before a quantitative value, the parameter also includes the specific quantitative value itself unless expressly stated otherwise.

As used herein, the term or phrase "effective," "effective amount," or "conditions effective to" refers to such amount or condition that is capable of performing the function or property for which an effective amount or condition is expressed. As will be pointed out below, the exact amount or particular condition required will vary from one aspect to another, depending on recognized variables such as the materials employed and the processing conditions observed. Thus, it is not always possible to specify an exact "effective amount" or "condition effective to." However, it should be understood that an appropriate, effective amount will be readily determined by one of ordinary skill in the art.

When a range is expressed, a further aspect includes from the one particular value and to the other particular value. For example, where the stated range includes one or both of the limits, ranges excluding either or both of those included limits are also included in the disclosure, e.g., the phrase "x to y" includes the range from 'x' to 'y' as well as the range greater than 'x' and less than 'y'. The range can also be expressed as an upper limit, e.g., 'x, y, z, or less' and should be interpreted to include the specific ranges of 'x,' 'y,' 'z,' 'about x,' 'about y,' and 'about z' as well as the ranges of 'less than x,' 'less than y, or 'less than z,' or 'less than about x,' 'less than about y, and 'less than about z.' Likewise, the phrase 'x, y, z, or greater' should be interpreted to include the specific ranges of 'x,' 'y,' 'z,' 'about x,' 'about y,' and 'about z' as well as the ranges of 'greater than x,' greater than y,' 'greater than z,' or 'greater than about x,' greater than about y,' 'greater than about z.' In addition, the phrase "'x' to 'y'," where 'x' and 'y' are numerical values, also includes "about 'x' to about 'y'."

Such a range format is used for convenience and brevity and, thus, should be interpreted flexibly to include not only the numerical values explicitly recited as the limits of the range but also to include all the individual numerical values or sub-ranges encompassed within that range as if each numerical value and sub-range is explicitly recited. To illustrate, a numerical range of "0.1% to 5%" should be interpreted to include not only the explicitly recited values of 0.1% to 5% but also include individual values (e.g., 1%, 2%, 3%, and 4%) and the sub-ranges (e.g., 0.5% to 1.1%; 5% to 2.4%; 0.5% to 3.2%, and 0.5% to 4.4%, and other possible sub-ranges) within the indicated range.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, a description of a range such as from 1 to 6 should be considered to have specifically disclosed subranges such as from 1 to 3, from 1 to 4, from 1 to 5, from 2 to 4, from 2 to 6, from 3 to 6, etc., as well as individual numbers within that range, for example, 1, 2, 2.7, 3, 4, 5, 5.3, 6 and any whole and partial increments therebetween. This applies regardless of the breadth of the range.

In still further aspects, when the specific values are disclosed between two end values, it is understood that these end values can also be included.

In still further aspects, when the range is given, and exemplary values are provided, it is understood that any ranges can be formed between any exemplary values within the broadest range. For example, if individual numbers 1, 2, 3, 4, 5, 6, 7, etc. are disclosed, then the ranges 1-7, 2-7, 3-7, 4-7, 5-7, 6-7, 1-6, 1-5, 1-4, 1-3, 1-2, 2-6, 2-5, etc. are also disclosed.

References in the specification and concluding claims to parts by weight of a particular element or component in a composition denote the weight relationship between the element or component and any other elements or components in the composition or article for which a part by weight is expressed. Thus, in a mixture containing 2 parts by weight of component X and 5 parts by weight, components Y, X, and Y are present at a weight ratio of 2:5 and are present in such a ratio regardless of whether additional components are contained in the mixture.

A weight percent (wt. %) of a component, unless specifically stated to the contrary, is based on the total weight of the formulation or composition in which the component is included. A mol percent (mol %) of a component, unless specifically stated to the contrary, is based on the total moles of the components present in the formulation or composition in which the recited component is included.

As used herein, the term "composition" is intended to encompass a product comprising the specified ingredients in the specified amounts, as well as any product that results, directly or indirectly, from a combination of the specified ingredients in the specified amounts. It is understood that the term "glass composition," as disclosed herein, refers to a glass that was melted to form a defined composition but before it was formed into a specific glass article. It is further understood that the glass composition as used herein is not the same as batch ingredients that were introduced into the mix before forming the glass. In some aspects, the batch ingredients used to form the composition can comprise elements that the glass composition is substantially free of.

A weight percent (wt. %) of a component, unless specifically stated to the contrary, is based on the total weight of the formulation or composition in which the component is included. In the aspects where the glass compositions are described, the concentration of constituent components (e.g., $SiO_2$, $Al_2O_3$, $B_2O_3$, and the like) are given in a mole percent (mol %) on an oxide basis unless otherwise specified.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

As used herein, the term "and/or" includes any and all combinations of one or more of the associated listed items.

It will be understood that the terms "first," "second," etc., may be used herein to describe various elements, components, regions, layers, and/or sections. These elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

As used herein, the term "substantially" means that the subsequently described event or circumstance completely occurs or that the subsequently described event or circumstance generally, typically, or approximately occurs.

Still further, the term "substantially" can, in some aspects, refer to at least about 80%, at least about 85%, at least about 90%, at least about 91%, at least about 92%, at least about 93%, at least about 94%, at least about 95%, at least about 96%, at least about 97%, at least about 98%, at least about 99%, or about 100% of the stated property, component, composition, or other condition for which substantially is used to characterize or otherwise quantify an amount.

In other aspects, as used herein, the term "substantially free," when used in the context of a composition or component of a composition that is substantially absent, is intended to refer to an amount that is then about 1% by weight, e.g., less than about 0.5% by weight, less than about 0.1% by weight, less than about 0.05% by weight, or less than about 0.01% by weight of the stated material, based on the total weight of the composition.

As used herein, the terms "substantially identical reference composition," "substantially identical reference article," or "substantially identical reference electrochemical cell" refer to a reference composition, article, or electrochemical cell comprising substantially identical components in the absence of an inventive component. In another exemplary aspect, the term "substantially," in, for example, the context "substantially identical reference composition," or "substantially identical reference article," or "substantially identical reference electrochemical cell," refers to a reference composition, article, or an electrochemical cell comprising substantially identical components and wherein an inventive component is substituted with a common in the art component.

As used herein, the term "melting point" refers to a temperature at which the batch materials fully melt to obtain a homogeneous liquid. By glass industry convention, the melting point occurs at a liquid viscosity of around 10-20 Pa·s.

While aspects of the present invention can be described and claimed in a particular statutory class, such as the system statutory class, this is for convenience only and one of ordinary skill in the art will understand that each aspect of the present invention can be described and claimed in any statutory class. Unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is in no way intended that an order be inferred in any respect. This holds for any possible non-express basis for interpretation, including matters of logic with respect to the arrangement of steps or operational flow, plain meaning derived from grammatical organization or punctuation, or the number or type of aspects described in the specification.

The present invention may be understood more readily by reference to the following detailed description of various aspects of the invention and the examples included therein and to the Figures and their previous and following description.

Devices

Over decades, Moore's Law has fueled the integration of more computing capabilities onto single silicon chips embodied in system-on-chip (SoC) designs. However, transistor costs are rapidly rising for sophisticated chips at advanced nodes, facing hurdles from technology complexity and manufacturing yield issues. These escalating costs for complex monolithic SoCs contrast the diverse performance, efficiency, and form factor demands of emerging workloads across artificial intelligence (AI), 5G, the internet-of-things (IoT), and automotive domains. System-on-package (SoP) architecturally separates specialized functions into modular chiplet blocks that are heterogeneously integrated onto a package. By mixing tailored pieces leveraging the most suitable process per purpose, system-on-package promises adaptable, cost-optimized scaling unconstrained by the limitations of any individual chip technology for the hardware needs of the future.

The full benefits of system-on-package integration hinge on innovating high-performance interposer materials and interfaces. Interposer materials present respective fabrication challenges and device-level tradeoffs in power, thermal, and reliability parameters. Moreover, the incorporation of new frequency bands in the millimeter-wave (mm-wave) spectrum for the upcoming generations of communications has accentuated the challenge of increased propagation losses. Consequently, there is a growing emphasis on the exploration of new materials with low loss to address this issue. Additionally, low permittivity is also desired, as it facilitates faster propagation of electromagnetic waves, given the inverse relationship between propagation speed and dielectric constant. Furthermore, lower permittivity contributes to a reduction in capacitive coupling between adjacent conductors.

Glass offers key virtues for millimeter wave system packaging due to its low fabrication cost and high tunability of its properties. With intrinsically low surface roughness, glass can enable fine lithographic patterning below 8 micrometers to fabricate dense signal features. At the right composition, glass thermal expansion traits can be matched with other package components for reliable long-term operation. Dimensional stability also proves superior on glass backing structures compared to organic substrates, critical for the high frequencies and tolerances in next-generation wireless modules. By leveraging these useful optical and physical properties, glass interposers promise a high-performance pathway to integrate diverse functions like antenna arrays into sophisticated multifunction millimeter wave electronic assemblies.

The dielectric properties of silicate glasses are linked to composition and structure. Bulk ionic transport of alkali modifiers contributes to conductivity and dielectric loss at frequencies below one MHz. The microwave dielectric loss of crystalline dielectrics has been linked to infrared (IR) lattice mode damping and phonon scattering. Far IR spectra of perovskite ceramics were correlated with microwave loss by summing the contributions of each oscillator to the dielectric loss in the GHz frequency range. Additional vibrational modes appear in amorphous networks over ordered crystalline structures, and the increased structural dynamics contribute to dielectric loss in the GHz frequency range. Density-of-states calculations from neutron scattering experiments in alkali-modified silica have shown a maximum energy peak of 4 meV for molecular vibrations, corresponding to 1 THz. Dielectric measurements in the THz frequency range have revealed loss peaks in the 1-10 THz range. The additional modes from amorphous structures over crystalline structures contribute to the dielectric response and increased loss at microwave frequency.

The structure-processing relationship allows designing glass compositions to precisely meet target dielectric performance specs by defining local molecular arrangements despite lacking long-range periodic order. Understanding the link between a material's molecular structure and its dielectric characteristics involves a crucial parameter known as ionic polarizability. The Clausius-Mossotti equation emerges as a valuable tool, enabling the estimation of a material's permittivity by incorporating the polarizability values of its constituent ions and its density:

$$\epsilon_r = \frac{3V_m + 8\pi\alpha_D^T}{3V_m - 4\pi\alpha_D^T} \quad (1)$$

$$V_m = \frac{\text{MW}}{\rho N_A} \quad (2)$$

where $V_m$ is the molar volume (in Å$^3$), $\alpha^T_D$ is the total dielectric polarizability, MW is the molecular weight, ρ is the glass density, and $N_A$ is Avogadro's number. A comprehensive compilation of polarizability data for various ions in crystalline materials was curated by Shannon. Notably, boron stands out with the lowest recorded polarizability of 0.05 Å$^3$, while silicon and oxygen exhibit values of 0.87 Å3 and 2.01 Å$^3$, respectively. Typical glass modifiers, such as Li, Na, Mg, and Ca, possess polarizability values of 1.2 Å$^3$, 1.8 Å$^3$, 1.32 Å$^3$, and 3.16 Å$^3$, sequentially.

Previous research showcases that the polarizability of ions in non-crystalline states, such as glass and fused silica, surpasses that observed in crystalline states like quartz. This discrepancy in ionic polarizability between a material's crystalline and amorphous phases demonstrates a proportional relationship with the measured dielectric loss across a broad spectrum in the mm-wave bands. Using elements with lower polarizability allows for a decrease in the difference between crystalline and amorphous counterparts and, therefore, obtaining low-loss glasses.

Boron can be added to silica as single-phase glass formers. It enters the silica tetrahedral network and creates silicon-oxygen-boron linkages.

Phase-separated glass with distinct regions of high-purity glass former (i.e., Si and B) will have the lowest dielectric loss. In addition, glass compositions with a high amount of boron will have the lowest dielectric constant, allowing the formation of a desired substrate for a device. Without wishing to be bound by any theory, it is assumed that the phase-separated glass predominantly has Si—O—Si and B—O—B linkages, which have lower polarizability than glass formers attached to other ions (i.e., Si—O-ion, B—O-ion). In such aspects, the ion can behave as a modifier or a separate network-former species.

In some aspects, disclosed herein is a device comprising a substrate comprising a phased-separated borosilicate glass with high boron content. The low polarizability of the boron and the fact that both mixtures of glass formers $B_2O_3$ and $SiO_2$ are immiscible provide a microstructure and have lower dielectric constant and loss than any commercial glasses in the mm-wave THz frequency range.

In still further aspects, disclosed herein is a device comprising: a glass substrate comprising a glass structure comprising $xB_2O_3$-(100-x)$SiO_2$, wherein x is greater than or equal to 10 mol % and less than 100 mol %, wherein the glass structure comprises two or more immiscible phases, wherein the glass substrate has a dielectric constant lower than 6, and wherein the glass substrate has a dielectric loss tangent equal to or less than 1×10−2 in a frequency range from 1 GHZ to 1 THz.

In still further aspects, also disclosed herein is a device comprising: a glass substrate comprising a glass composition comprising $xB_2O_3$-$ySiO_2$-$zM_2O$, wherein 10≤x<100 by mol %; wherein 0<y<90 by mol %; wherein M is an alkali metal and wherein 0≤sz≤10 by mol %. In such exemplary and unlimiting aspects, the glass can form a structure comprising two or more immiscible phases. In still further aspects, the glass comprising the disclosed above composition and the structure can also exhibit a dielectric constant lower than 6. In still further aspects, the glass comprising the disclosed above composition and the structure can also exhibit a dielectric loss tangent equal to or less than 1×10−2 in a frequency range from 1 GHz to 1 THz.

In still further aspects, x can be greater than or equal to 10 mol % to less than 100 mol % including exemplary values of 15 mol %, 20 mol %, 25 mol %, 30 mol %, 35 mol %, 40 mol %, 45 mol %, 50 mol %, 55 mol %, 60 mol %, 65 mol %, 70 mol %, 75 mol %, 80 mol %, 85 mol %, 90 mol %, 95 mol %, and 99 mol %. In still further aspects, x can have any value between any two foregoing values, or it can fall within any range formed by any two of the foregoing values. For example, and without limitations, x can form the following ranges 10≤x<100, 15≤x<100, 20≤x<100, 25≤x<100, 30≤x<100, 33≤x<100, 35≤x<100, 40≤x<100, 45≤x<100, 50≤x<100, 55≤x<100, 60≤x<100, 65≤x<100, 70≤x<100, 75≤x<100, 80≤x<100, or 85≤x<100 by mol %. In still further aspects, x can form the following ranges 10<x<100, 15<x<100, 20<x<100, 25<x<100, 30<x<100, 33<x<100, 35<x<100, 40<x<100, 45<x<100, 50<x<100, 55<x<100, 60<x<100, 65<x<100, 70<x<100, 75<x<100, 80<x<100, or 85<x<100 by mol %. Yet in other aspects, x can form the following ranges 10≤x≤99, 10≤x≤95, 10≤x≤90, 10≤x≤85, 10≤x≤80, 15≤x≤80, 20≤x≤80, 25≤x≤80, 30≤x≤80, 33≤x≤80, 35≤x≤80, 40≤x≤80, 45≤x≤80, 50≤x≤80, 55≤x≤80, 60≤x≤80, 65≤x≤80, $70\leq x\$80$, 75≤x≤80, by mol % and so on. In still further aspects, x can form the following ranges 10<x<99, 10<x<95, 10<x<90, 10<x<85, 10<x<80, 15<x<80, 20<x<80, 25<x<80, 30<x<80, 33<x<80, 35<x<80, 40<x<80, 45<x<80, 50<x<80, 55<x<80, 60<x<80, 65<x<80, 70<x<80, 75<x<80, by mol % and so on. Again, it is understood that x can fall within any of the disclosed above ranges.

In still further aspects, y can be greater than 0 mol % to less than 90 mol %, including exemplary values of 0.5 mol %, 1 mol %, 5 mol %, 10 mol %, 15 mol %, 20 mol %, 25 mol %, 30 mol %, 35 mol %, 40 mol %, 45 mol %, 50 mol %, 55 mol %, 60 mol %, 65 mol %, 70 mol %, 75 mol %, 80 mol %, 85 mol %, and 89 mol %. In still further aspects, y can have any value between any two foregoing values, or it can fall within any range formed by any two of the foregoing values. For example, and without limitations, y can form the following ranges 0<y<90, 0.1≤y<90, 0.5≤y<90, 1≤y<90, 5≤y<90, 10≤y<90, 15≤y<90, 20≤y<90, 25≤y<90, 30≤y<90, 35≤y<90, 40≤y<90, 45≤y<90, 50≤y<90, 55≤y<90, 60≤y<90, 65≤y<90, 70≤y<90, or 75≤y<90 by mol %. Yet in other aspects, y can form the following ranges 0<y<90, 0<y≤85, 0<y≤80, 0<y≤75, 0<y≤70, 0<y≤66, 0<y≤60, 0<y≤55, 0<y≤50, 0<y≤45, 0<y≤40, 0<y≤35, 0<y≤30, 0<y≤25, 0<y≤20, or 0<y≤15, by mol %, and so on. Again, it is understood that y can fall within any of the disclosed above ranges.

In still further aspects, a molar ratio of B to Si is at least 1:1. In yet other aspects, a molar ratio of B to Si is 1:1. In still further aspects, a molar ratio of B to Si is grater than 1, greater than 1.2, greater than 1.5, or greater than 2.

In still further aspects, M (the alkali metal) can be optional. In such an aspect, z is zero. In yet other aspects, M can be present in any amount greater than 0 mol % to less than or equal to 10 mol %. In still further aspects, z can be 0 mol %, 0.1 mol %, 0.5 mol %, 1 mol %, 2 mol %, 3 mol %, 4 mol %, 5 mol %, 6 mol %, 7 mol %, 8 mol %, 9 mol %, or 10 mol %. In still further aspects, z can have any value between any two foregoing values, or it can fall within any range formed by any two of the foregoing values. For example, and without limitations, y can form the following ranges 0≤z≤10, 0.05≤z≤10, 0.1≤z≤10, 0.5≤z≤10, 0.7≤z≤10, 1≤z≤10, 1.5≤z≤10, 2≤z≤10, 2.5≤z≤10, 3≤z≤10, 3.5≤z≤10, 4≤z≤10, 4.5≤z≤10, 5≤z≤10, 5.5≤z≤10, 6≤z≤10, 6.5≤z≤10, 7≤z≤10, 7.5≤z≤10, 8≤z≤10, 8.5≤z≤10, 9≤z≤10, or 9.5≤z≤10 by mol %. Yet in other aspects, z can form the following ranges 0≤z≤10, 0≤z≤9.5, 0≤z≤9, 0≤z≤8.5, 0≤z≤8, 0≤z≤7.5, 0≤z≤7, 0≤z≤6.5, 0≤z≤6.0, 0≤z≤5.5, 0≤z≤5, 0≤z≤4.5, 0≤z≤4, 0≤z≤3.5, 0≤z≤3, 0≤z≤2.5, 0≤z≤2, 0≤z≤1.5, or 0≤z≤1.5, by mol %, and so on. Again, it is understood that z can fall within any of the disclosed above ranges.

In still further aspects, the glass structure is substantially smooth. In yet still further aspects, the glass structure is substantially free of porosity. Exemplary SEM images of the glass substrates disclosed herein are shown in FIGS. 2A-2D. In still further aspects, a size of each individual phase can be 1 nanometer to 100 microns, including exemplary values of 10 nm, 25 nm, 50 nm, 100 nm, 250 nm, about 500 nm, 750 nm, 1 micron, 10 microns, 20 microns, 30 microns, 40 microns, 50 microns, 60 microns, 70 microns, 80 microns, and 90 microns. In still further aspects, each phase can have any size value between any two foregoing values, or it can fall within any range formed by any two of the foregoing values. For example, and without limitations, each phase can have a size of 1 nm to 100 microns, 1 nm to 90 microns, 1 nm to 80 microns, 1 nm to 70 microns, 1 nm to 60 microns, 1 nm to 50 microns, 1 nm to 40 microns, 1 nm to 30 microns, 1 nm to 20 microns, 1 nm to 10 microns, 1 nm to 1 microns, 1 nm to 750 nm, 1 nm to 500 nm, 1 nm to 250 nm, 1 nm to 100 nm and so on. In yet other aspects, each phase can have a size of 10 nm to 100 microns, 50 nm to 100 microns, 100 nm to 100 microns, 250 nm to 100 microns, 500 nm to 100 microns, 750 nm to 100 microns, 1 micron to 100 microns, 10 microns to 100 microns, 30 microns to 100 microns, 50 microns to 100 microns, or 60 microns to 100 microns. In some aspects, the boron phase can have a size greater than the silicon phase. Yet, in other aspects, the silicon phase can be greater than the boron phase. Yet, in still further aspects, the boron phase and silicon phase can be substantially identical in size.

In still further aspects, the glass substrate has a dielectric constant lower than 6, lower than 5.5, lower than 5, lower than 4.5, lower than 4, lower than 3.5, lower than 3, or even lower than 2.5. In still further aspects, the glass substrate can have a dielectric constant of 2 to 6, including exemplary values of 2.5, 3, 3.5, 4, 4.5, 5, and 5.5. In still further aspects, the dielectric constant can have any value between any two foregoing values, or it can fall within any range formed by any two of the foregoing values. For example, and without limitations, the dielectric constant can be 2 to 6, 2 to 5.5, 2 to 5, 2 to 4.5, 2 to 4, 2 to 3.5, 2 to 3, or 2 to 2.5. In yet further aspects, the dielectric constant can be 2.5 to 6, 3 to 6, 3.5 to 6, 4 to 6, 4.5 to 6, or 5 to 6, and so on.

In still further aspects, the glass substrate has a dielectric loss tangent equal to or less than 1×10−2, equal to or less than 8×10−3, equal to or less than 5×10 3, equal to or less than 1×10−3, equal to or less than 8×10−4, equal to or less than 5×10−4, or equal to or less than 1×10−4, in a frequency range from 1 GHz to 1 THz, including exemplary values of 10 GHz, 50 GHz, 100 GHz, 150 GHz, 200 GHz, 250 GHz, 300 GHz, 350 GHz, 400 GHz, 450 GHz, 500 GHz, 550 GHz, 600 GHz, 650 GHz, 700 GHZ, 750 GHZ, 900 GHZ, and 950 GHz. In still further aspects, the dielectric loss tangent can have any of the disclosed above values in a frequency range that has a value that falls between any two foregoing values, or it can fall within any range formed by any two of the foregoing values. For example, and without limitations, the dielectric loss tangent can be to or less than 1×10−2, equal to or less than 8×10−3, equal to or less than 5×10−3, equal to or less than 1×10−3, equal to or less than 8×10−4, equal to or less than 5×10−4, or equal to or less than 1×10−4, in a frequency range 1 GHz to 1 THz, 10 GHz to 1 THz, 25 GHz to 1 THz, 50 GHz to 1 THz, 100 GHz to 1 THz, 200 GHz to 1 THz, 300 GHz to 1 THz, 400 GHz to 1 THz, 500 GHz to 1 THz, 600 GHz to 1 THz, 700 GHz to 1 THz, 800 GHz to 1 THz, 900 GHz to 1 THz, 1 GHz to 950 GHz, 1 GHz to 900 GHz, 1 GHz to 750 GHz, 1 GHz to 500 GHz, 1 GHz to 250 GHz, 1 GHz to 100 GHz, 1 GHz to 50 GHz, 1 GHZ to 10 GHz, and so on.

In still further aspects, the glass substrate has a dielectric loss tangent of $1\times10^{-4}$ to $3\times10^{-3}$, including exemplary values of $2\times10^{-4}$, $3\times10^{-4}$, $5\times10^{-4}$, $6\times10^{-4}$, 7×10 4, $8\times10^{-4}$, $9\times10^{-4}$, $1\times10^{-3}$, and $2\times10^{-3}$, in a frequency range from 1 GHz to 200 GHZ, including exemplary values of 10 GHZ, 20 GHZ, 30 GHZ, 40 GHZ, 50 GHz, 60 GHZ, 70 GHz, 80 GHZ, 90 GHz, 100 GHz, 110 GHz, 120 GHZ, 130 GHz, 140 GHz, 150 GHz, 160 GHz, 170 GHz, 180 GHz, and 190 GHz. In still further aspects, the dielectric loss tangent can have any value that falls between any foregoing values or can fall in a range formed by any of the foregoing values. Such dielectric loss tangent values can be in a frequency range that has a value that falls between any two foregoing values, or it can fall within any range formed by any two of the foregoing values. For example, and without limitations, the dielectric loss tangent can be $1\times10^{-4}$ to $3\times10^{-3}$, $2\times10^{-4}$ to $3\times10^{-3}$, $3\times10^{-4}$ to $3\times10^{-3}$, $4\times10^{-4}$ to $3\times10^{-3}$, $5\times10^{-4}$ to $3\times10^{-3}$, $6\times10^{-4}$ to $3\times10^{-3}$, $7\times10^{-4}$ to $3\times10^{-3}$, $8\times10^{-4}$ to $3\times10^{-3}$, $9\times10^{-4}$ to $3\times10^{-3}$, $1\times10^{-4}$ to $2\times10^{-3}$, $1\times10^{-4}$ to $1\times10^{-3}$, $1\times10^{-4}$ to $9\times10^{-4}$, $1\times10^{-4}$ to $8\times10^{-4}$, $1\times10^{-4}$ to $7\times10^{-4}$, $1\times10^{-4}$ to $6\times10^{-4}$, $1\times10^{-4}$ to $5\times10^{-4}$, $1\times10^{-4}$ to $4\times10^{-4}$, or $1\times10^{-4}$ to $3\times10^{-4}$, in a frequency range of 1 GHz to 200 GHz, 10 GHz to 200 GHz, 50 GHz to 200 GHz, 70 GHz to 200 GHz, 100 GHz to 200 GHz, 150 GHz to 200 GHz, or 1 GHz to 150 GHz, 1 GHz to 100 GHz, 1 GHz to 70 GHz, 1 GHz to 50 GHz, or 1 GHz to 20 GHz.

In still further aspects, M is Li, Na, K, or a combination thereof.

In still further aspects, the disclosed device comprises a glass substrate having a coefficient of thermal expansion of 5 to 15 ppm/° C., including exemplary values of 6 ppm/° C., 7 ppm/° C., 8 ppm/° C., 9 ppm/° C., 10 ppm/° C., 11 ppm/° C., 12 ppm/° C., 13 ppm/° C., and 14 ppm/° C. In still further aspects, the coefficient of thermal expansion can have any value that falls between any foregoing values or can fall in a range formed by any of the foregoing values. For example, and without limitations, the coefficient of thermal expansion can be 5 to 15 ppm/° C., 5 to 14 ppm/° C., 5 to 13 ppm/° C., 5 to 12 ppm/° C., 5 to 11 ppm/° C., 5 to 10 ppm/° C., 5 to 9 ppm/° C., 5 to 8 ppm/° C., 5 to 7 ppm/° C., 5 to 6 ppm/° C., 6 to 15 ppm/° C., 7 to 15 ppm/° C., 8 to 15 ppm/° C., 9 to 15 ppm/° C., 10 to 15 ppm/° C., 11 to 15 ppm/° C., or 12 to 15 ppm/° C.

In still further aspects, a first phase of the two or more phases has a first permittivity higher than a second permittivity of a second phase of the two or more phases. For example, and without limitations in some aspects, the permittivity of a silicon oxide phase can be higher than the permittivity of a boron oxide phase.

In some aspects, the two or more phases can at least partially penetrate each other. In such exemplary aspects, while the phases can penetrate each other, they remain immiscible. In certain aspects, one of the two or more phases can form a core surrounded by a second of the two or more phases. In certain aspects, if more than two phases are present, each of the phases can form a core surrounded by a sheath having at least one of the remaining phases. In still further aspects, the two or more phases can form other configurations. For example, and without limitations, the two or more configurations can form a side-by-side configuration, a core-sheath configuration, a segmented configuration, an islands-in-the-sea configuration, or any combination thereof.

In still further aspects, at least one of the two or more phases can be present as one or more droplets. The droplets can be any size. In still further aspects, the droplets can form one or more aggregates. In still further aspects, droplets can be 1 nanometer to 100 microns, including exemplary values of 10 nm, 25 nm, 50 nm, 100 nm, 250 nm, 500 nm, 750 nm, 1 micron, 10 microns, 20 microns, 30 microns, 40 microns, 50 microns, 60 microns, 70 microns, 80 microns, and 90 microns. In still further aspects, the droplets can have any size value between any two foregoing values, or they can fall within any range formed by any two of the foregoing values. For example, and without limitations, the droplets can be 1 nm to 100 microns, 1 nm to 90 microns, 1 nm to 80 microns, 1 nm to 70 microns, 1 nm to 60 microns, 1 nm to 50 microns, 1 nm to 40 microns, 1 nm to 30 microns, 1 nm to 20 microns, 1 nm to 10 microns, 10 nm to 100 microns, 20 nm to 100 microns, 30 nm to 100 microns, 40 nm to 100 microns, 50 nm to 100 microns, 60 nm to 100 microns, 70 nm to 100 microns, 80 nm to 100 microns, or 90 nm to 100 microns.

In still further aspects, when M is greater than 0 in the glass composition, M can be present in any of the two or more immiscible phases. In still further aspects, M, when present in an amount greater than 0, is present in the boron phase. It is further understood that the distribution of M in either phase can be controlled by a cooling temperature and cooling rate. It is further understood that the amount of M can determine its distribution in either or both phases.

In certain aspects, if desired, the glass substrate can have additional glass-forming components and/or modifiers. In such exemplary and unlimiting aspects, the glass forming components and/or modifiers can be present in an amount of less than 1000 ppm, less than 900 pm, less than 800, less than 700, less than 600 pm, less than 500 ppm, less than 400 ppm, less than 300 ppm, less than 200 ppm, or even less than 100 ppm. In still further aspects, the glass forming components and/or modifiers can be present in an amount of 10 ppm to 1000 ppm, including exemplary values of 20 ppm, 30 ppm, 40 ppm, 50 ppm, 60 ppm, 70 ppm, 80 ppm, 90 ppm, 100 ppm, 200 ppm, 300 ppm, 400 ppm, 500 ppm, 600 ppm, 700 ppm, 800 ppm, and 900 ppm. In still further aspects, the glass-forming components and/or modifiers can be present in any value falling between any two foregoing values, or it can fall within any range formed by any two of the foregoing values. For example, and without limitations, the glass-forming components and/or modifiers can be present in amounts of 10 ppm to 1000 ppm, 10 ppm to 900 ppm, 10 ppm to 500 ppm, 10 ppm to 300 ppm, 10 ppm to 100 ppm, 100 ppm to 1000 ppm, 300 ppm to 1000 ppm, 500 ppm to 1000 ppm, or 800 ppm to 1000 ppm, and so on.

In such exemplary and unlimiting aspects, the one or more glass-forming components and/or modifiers comprise aluminum oxide, barium oxide, calcium oxide, or a combination thereof.

In yet still further aspects, the glass structure is substantially free of a crystalline phase.

In still further aspects, the glass structure is substantially resistant to corrosion. In certain aspects, a surface of the glass structure and composition can be further modified to improve glass substrate corrosion properties.

In still further aspects, the disclosed herein device comprises a glass substrate that is patterned. It is understood that the glass substrate can have any pattern suitable for a desired application. In certain aspects, the glass substrate is patterned to form one or more pathways for an integration of one or more predetermined components. For example, the glass can be patterned to form one or more vias. In such aspects, the one or more vias can extend at least through a portion of a glass substrate thickness. Yet, in other aspects, the one or more vias can extend through an entire thickness of the glass. In still further aspects, the vias of the disclosed glass substrate can be at least partially filled. In such aspects, the one or more vias comprise a metal, a metal alloy, a metal composite, a ceramic, a dielectric, a polymer, or a combination thereof.

In certain aspects, the glass substrate can be patterned to form one or more channels on at least one surface of the glass substrate. It is understood that these channels can extend through an entire length/width of the substrate or can form a specific pattern depending on a desired application. In certain aspects, the channels can at least partially extend into the thickness of the glass substrate. In yet still further aspects, the one or more channels comprise a metal, a metal alloy, a metal composite, a ceramic, a dielectric, a polymer, or a combination thereof.

In still further aspects, the glass substrate can comprise a coating disposed on at least one surface of the glass substrate. It is understood that in some aspects, the coating can be disposed directly on a surface of the glass substrate. While in other aspects, the coating can be disposed indirectly on a surface of the glass substrate having one or more layers disposed between the coating and the glass surface. In such aspects, the coating can be disposed in any desired pattern and can comprise a metal, a metal alloy, a metal composite, a ceramic, a dielectric, a polymer, or a combination thereof.

In still further aspects, the glass substrate can have any predetermined shape. For example, and without limitations, the glass substrate can have rectangular, circular, square, triangular, prismatic, spherical, or cylindrical (fiber) shapes.

In still further aspects, the glass substrate can have a thickness of 500 nm to 3 cm, including exemplary values of 600 nm, 700 nm, 800 nm, 900 nm, 1 micron, 10 microns, 50 microns, 100 microns, 250 microns, 500 microns, 750 microns, 1 mm, 5 mm, 1 cm, 1.5 cm, 2 cm, and 2.5 cm. In still further aspects, the glass substrate can have any thickness value falling between any two foregoing values, or it can fall within any range formed by any two of the foregoing values. For example, and without limitations, the glass substrate can have any thickness of 500 nm to 3 cm, 1 micron to 3 cm, 50 microns to 3 cm, 200 microns to 3 cm, 500 microns to 3 cm, 1 mm to 3 cm, 5 mm to 3 cm, 1 cm to 3 cm, 500 nm to 1 cm, 500 nm to 1 mm, 500 nm to 500 microns, 500 nm to 250 microns, 500 nm to 100 microns, 500 nm to 50 microns, 500 nm to 1 micron, and so on.

Figure 3:
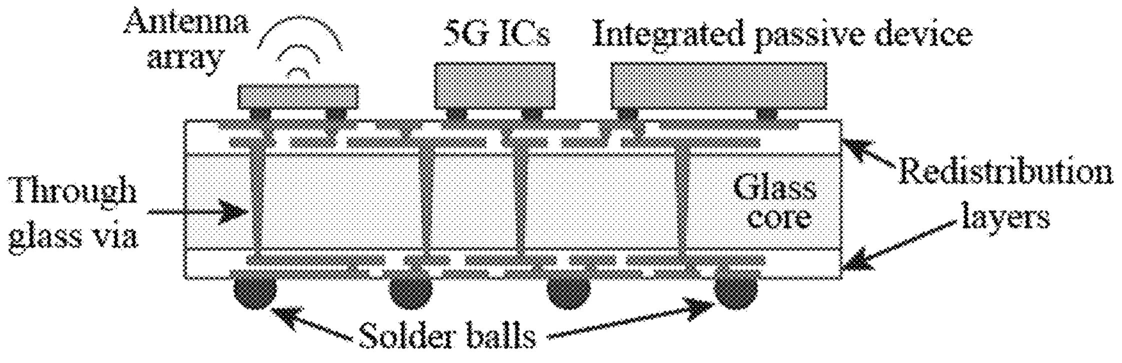
FIG. 3 depicts an exemplary device where the glass core is an exemplary glass substrate.

In still further aspects, the device disclosed herein can be any device that can have the disclosed herein glass substrate. In still further aspects, the device can comprise a discrete component, an integrated passive device, an antenna, an RF bridge, a diode sub-mount, a fiber alignment, a filter, a resonator, a capacitor, an inductor, a resistor, a substrate integrated waveguide device, an interposer, an electronic packaging, a semiconductor, microprocessor, mm-wave integrated circuit, metasurface, or any combination thereof. An exemplary and unlimiting device is shown in FIG. 3.

Also disclosed herein are compositions that can comprise glass-bonded ceramics. In such aspects, the glass-bonded ceramic can comprise a glass comprising $xB_2O_3$_$(100-x)SiO_2$; one or more of aluminum oxide, aluminum nitride, silicon carbide, silicon nitride, or silicate minerals, and wherein the glass-bonded ceramic has a dielectric loss tangent equal to or less than 1×10−2 in a frequency range from 1 GHz to 1 THz.

A glass-bonded ceramic comprising: a glass composition comprising $xB_2O_3$-$ySiO_2$-$zM_2O$, wherein $10 \le x < 100$ by mol %; wherein $0 < y < 90$ by mol %; wherein M is an alkali metal and wherein $0 \le z \le 10$ by mol %, and one or more of aluminum oxide, aluminum nitride, silicon carbide, silicon nitride, or silicate minerals, wherein the glass-bonded ceramic has a dielectric loss tangent equal to or less than 1×10−2 in a frequency range from 1 GHz to 1 THz.

In still further aspects, x can be greater than or equal to 10 mol % to less than 100 mol % including exemplary values of 15 mol %, 20 mol %, 25 mol %, 30 mol %, 35 mol %, 40 mol %, 45 mol %, 50 mol %, 55 mol %, 60 mol %, 65 mol %, 70 mol %, 75 mol %, 80 mol %, 85 mol %, 90 mol %, 95 mol %, and 99 mol %. In still further aspects, x can have any value between any two foregoing values, or it can fall within any range formed by any two of the foregoing values. For example, and without limitations, x can form the following ranges $10\leq x<100$, $15\leq x<100$, $20\leq x<100$, $25\leq x<100$, $30\leq x<100$, $33\leq x<100$, $35\leq x<100$, $40\leq x<100$, $45\leq x<100$, $50\leq x<100$, $55\leq x<100$, $60\leq x<100$, $65\leq x<100$, $70\leq x<100$, $75\leq x<100$, $80\leq x<100$, or $85\leq x<100$ by mol %. In still further aspects, x can form the following ranges $10<x<100$, $15<x<100$, $20<x<100$, $25<x<100$, $30<x<100$, $33<x<100$, $35<x<100$, $40<x<100$, $45<x<100$, $50<x<100$, $55<x<100$, $60<x<100$, $65<x<100$, $70<x<100$, $75<x<100$, $80<x<100$, or $85<x<100$ by mol %. Yet in other aspects, x can form the following ranges $10\leq x\leq 99$, $10\leq x\leq 95$, $10\leq x\leq 90$, $10\leq x\leq 85$, $10\leq x\leq 80$, $15\leq x\leq 80$, $20\leq x\leq 80$, $25\leq x\leq 80$, $30\leq x\leq 80$, $33\leq x\leq 80$, $35\leq x\leq 80$, $40\leq x\leq 80$, $45\leq x\leq 80$, $50\leq x\leq 80$, $55\leq x\leq 80$, $60\leq x\leq 80$, $65\leq x\leq 80$, $70\leq x\leq 80$, $75\leq x\leq 80$, by mol % and so on. In still further aspects, x can form the following ranges $10<x<99$, $10<x<95$, $10<x<90$, $10<x<85$, $10<x<80$, $15<x<80$, $20<x<80$, $25<x<80$, $30<x<80$, $33<x<80$, $35<x<80$, $40<x<80$, $45<x<80$, $50<x<80$, $55<x<80$, $60<x<80$, $65<x<80$, $70<x<80$, $75<x<80$, by mol % and so on. Again, it is understood that x can fall within any of the disclosed above ranges.

In still further aspects, y can be greater than 0 mol % to less than 90 mol %, including exemplary values of 0.5 mol %, 1 mol %, 5 mol %, 10 mol %, 15 mol %, 20 mol %, 25 mol %, 30 mol %, 35 mol %, 40 mol %, 45 mol %, 50 mol %, 55 mol %, 60 mol %, 65 mol %, 70 mol %, 75 mol %, 80 mol %, 85 mol %, and 89 mol %. In still further aspects, y can have any value between any two foregoing values, or it can fall within any range formed by any two of the foregoing values. For example, and without limitations, y can form the following ranges $0<y<90$, $0.1\leq y<90$, $0.5\leq y<90$, $1\leq y<90$, $5\leq y<90$, $10\leq y<90$, $15\leq y<90$, $20\leq y<90$, $25\leq y<90$, $30\leq y<90$, $35\leq y<90$, $40\leq y<90$, $45\leq y<90$, $50\leq y<90$, $55\leq y<90$, $60\leq y<90$, $65\leq y<90$, $70\leq y<90$, or $75\leq y<90$ by mol %. Yet in other aspects, y can form the following ranges $0<y<90$, $0<y\leq 85$, $0<y\leq 80$, $0<y\leq 75$, $0<y\leq 70$, $0<y\leq 66$, $0<y\leq 60$, $0<y\leq 55$, $0<y\leq 50$, $0<y\leq 45$, $0<y\leq 40$, $0<y\leq 35$, $0<y\leq 30$, $0<y\leq 25$, $0<y\leq 20$, or $0<y\leq 15$, by mol %, and so on. Again, it is understood that y can fall within any of the disclosed above ranges.

In still further aspects, a molar ratio of B to Si is at least 1:1. In yet other aspects, a molar ratio of B to Si is 1:1. In still further aspects, a molar ratio of B to Si is greater than 1, greater than 1.2, greater than 1.5, or greater than 2.

In still further aspects, M (the alkali metal) can be optional. In such an aspect, z is zero. In yet other aspects, M can be present in any amount greater than 0 mol % to less than or equal to 10 mol %. In still further aspects, z can be 0 mol %, 0.1 mol %, 0.5 mol %, 1 mol %, 2 mol %, 3 mol %, 4 mol %, 5 mol %, 6 mol %, 7 mol %, 8 mol %, 9 mol %, or 10 mol %. In still further aspects, z can have any value between any two foregoing values, or it can fall within any range formed by any two of the foregoing values. For example, and without limitations, y can form the following ranges $0\leq z\leq 10$, $0.05\leq z\leq 10$, $0.1\leq z\leq 10$, $0.5\leq z\leq 10$, $0.7\leq z\leq 10$, $1\leq z\leq 10$, $1.5\leq z\leq 10$, $2\leq z\leq 10$, $2.5\leq z\leq 10$, $3\leq z\leq 10$, $3.5\leq z\leq 10$, $4\leq z\leq 10$, $4.5\leq z\leq 10$, $5\leq z\leq 10$, $5.5\leq z\leq 10$, $6\leq z\leq 10$, $6.5\leq z\leq 10$, $7\leq z\leq 10$, $7.5\leq z\leq 10$, $8\leq z\leq 10$, $8.5\leq z\leq 10$, $9\leq z\leq 10$, or $9.5\leq z\leq 10$ by mol %. Yet in other aspects, z can form the following ranges $0\leq z\leq 10$, $0\leq z\leq 9.5$, $0\leq z\leq 9$, $0\leq z\leq 8.5$, $0\leq z\leq 8$, $0\leq z\leq 7.5$, $0\leq z\leq 7$, $0\leq z\leq 6.5$, $0\leq z\leq 6.0$, $0\leq z\leq 5.5$, $0\leq z\leq 5$, $0\leq z\leq 4.5$, $0\leq z\leq 4$, $0\leq z\leq 3.5$, $0\leq z\leq 3$, $0\leq z\leq 2.5$, $0\leq z\leq 2$, $0\leq z\leq 1.5$, or $0\leq z\leq 1.5$, by mol %, and so on. Again, it is understood that z can fall within any of the disclosed above ranges.

In still further aspects, the glass-bonded ceramic has a dielectric loss tangent equal to or less than $1\times10^{-2}$, equal to or less than $8\times10^{-3}$, equal to or less than $5\times10^{-3}$, equal to or less than $1\times10^{-3}$, equal to or less than $8\times10^{-4}$, equal to or less than $5\times10^{-4}$, or equal to or less than $1\times10^{-4}$, in a frequency range from 1 GHZ to 1 THz, including exemplary values of 10 GHZ, 50 GHZ, 100 GHz, 150 GHz, 200 GHz, 250 GHz, 300 GHz, 350 GHz, 400 GHz, 450 GHz, 500 GHz, 550 GHz, 600 GHz, 650 GHz, 700 GHZ, 750 GHZ, 900 GHz, and 950 GHz. In still further aspects, the dielectric loss tangent can have any of the disclosed above values in a frequency range that has a value that falls between any two foregoing values, or it can fall within any range formed by any two of the foregoing values. For example, and without limitations, the dielectric loss tangent can be to or less than $1\times10^{-2}$, equal to or less than 8×10.3, equal to or less than $5\times10^{-3}$, equal to or less than $1\times10^{-3}$, equal to or less than $8\times10^{-4}$, equal to or less than $5\times10^{-4}$, or equal to or less than $1\times10^{-4}$, in a frequency range 1 GHz to 1 THz, 10 GHz to 1 THz, 25 GHz to 1 THz, 50 GHz to 1 THz, 100 GHz to 1 THz, 200 GHz to 1 THz, 300 GHz to 1 THz, 400 GHz to 1 THz, 500 GHz to 1 THz, 600 GHz to 1 THz, 700 GHz to 1 THz, 800 GHz to 1 THz, 900 GHz to 1 THz, 1 GHz to 950 GHz, 1 GHz to 900 GHz, 1 GHz to 750 GHz, 1 GHz to 500 GHz, 1 GHz to 250 GHz, 1 GHz to 100 GHz, 1 GHz to 50 GHZ, 1 GHz to 10 GHz, and so on.

In such exemplary and unlimiting aspects, the boron-rich phase and silicone-rich phase in the glass-ceramics can also be immiscible.

Also disclosed herein is an article comprising the disclosed glass-bonded ceramic.

In still further aspects, such an article can comprise a discrete component, an integrated passive device, an antenna, an RF bridge, a diode sub-mount, a fiber alignment, a filter, a resonator, a capacitor, an inductor, a resistor, a substrate integrated waveguide device, an interposer, an electronic packaging, a semiconductor, microprocessor, mm-wave integrated circuit, metasurface, or any combination thereof.

In still further aspects, the articles disclosed herein can be formed by any process. For example, the articles can be formed by a float or flat press process, a press-and-blow process, a fiber-drawing process, a blow-and-blow process, a waterfall process, a casting process, a slot draw, or any combination thereof.

Methods

Also disclosed herein are methods of making the disclosed compositions and the disclosed articles. In certain aspects, disclosed herein is a method comprising: mixing $B_2O_3$ and $SiO_2$ to form a mixture comprising $xB_2O_3$_(100-x)$SiO_2$, wherein x is greater than 10 mol % and less than 100 mol %, melting the mixture to form a molten liquid, cooling the molten liquid to form a glass substrate.

In still further aspects, the method comprises (a) forming a mixture comprising $xB_2O_3$-$ySiO_2$-$zM_2O$, wherein $10\leq x<100$ by mol % wherein $0<y<90$ by mol %; wherein M is an alkali metal and wherein $0\leq z\leq 10$ by mol % (b) melting the mixture to form a molten liquid, and cooling the molten liquid to form a glass substrate. It is understood that x, y, and z, can have any of the disclosed above values.

In certain aspects, the methods further comprise a step of calcining the mixture prior to the step of melting. In such exemplary and unlimiting aspects, the step of calcining is performed at a temperature of 150° C. to 250° C., including exemplary values of 160° C., 170° C., 180° C., 190° C., 200° C., 210° C., 220° C., 230° C., and 240° C., for a predetermined time. It is further understood that the calcining temperature can be any temperature that falls between any two foregoing values or falls in a range formed by any two foregoing values. For example and without limitations, the calcining temperature can be 150° C. to 250° C., 160° C. to 250° C., 170° C. to 250° C., 180° C. to 250° C., 190° C. to 250° C., 200° C. to 250° C., 210° C. to 250° C., 220° C. to 250° C., 230° C. to 250° C., 240° C. to 250° C., 150° C. to 240° C., 150° C. to 230° C., 150° C. to 220° C., 150° C. to 210° C., 150° C. to 200° C., 150° C. to 190° C., 150° C. to 180° C., 150° C. to 170° C., and so on.

It is understood that the predetermined time can be anywhere between 5 min to 5 hours, including exemplary values of 10 min, 30 min, 45 min, 1 h, 1.5 h, 2 h, 2.5 h, 3 h, 3.5 h, 4 h, and 4.5 h. It is further understood that the predetermined time can be any time that falls between any two foregoing values or falls in a range formed by any two foregoing values. For example and without limitations, the predetermined time can be 5 min to 5 hours, 10 min to 5 hours, 30 min to 5 hours, 45 min to 5 hours, 1 hour to 5 hours, 2.5 hours to 5 hours, 5 min to 2.5 hours, 5 min to 1 hour, 5 min to 45 min, 5 min to 30 min, 5 min to 25 min, 5 min to 10 min, and so on.

In still further aspects, the step of melting is performed at a temperature of 1400° C. to 1700° C., including exemplary values of 1,410° C., 1,420° C., 1,430° C., 1,440° C., 1,450° C., 1,460° C., 1,470° C., 1,480° C., 1,490° C., 1,500° C., 1,510° C., 1,520° C., 1,530° C., 1,540° C., 1,550° C., 1,560° C., 1,570° C., 1,580° C., 1,590° C. 1,600° C., 1,610° C., 1,620° C., 1,630° C., 1,640° C., 1,650° C., 1,660° C., 1,670° C., 1,680° C., and 1,690° C. It is further understood that the melting temperature can be any temperature that falls between any two foregoing values or falls in a range formed by any two foregoing values. For example and without limitations, the melting temperature can be 1400° C. to 1700° C., 1400° C. to 1650° C., 1400° C. to 1600° C., 1400° C. to 1550° C., 1400° C. to 1500° C., 1400° C. to 1450° C., 1450° C. to 1650° C., 1500° C. to 1650° C., 1550° C. to 1650° C., or 1600° C. to 1650° C., 1400° C. to 1700° C., and so on.

In still further aspects, the glass substrate can be further patterned the glass substrate to form one or more pathways for an integration of one or more predetermined components. It is understood that any known in the art patterning methods can be utilized. For example, and without limitations, the glass can be etched in an etching solution, plasma, laser, or any combination thereof. In still further aspects, any of the disclosed above patterns can be formed, such as vias, channels or coatings. In still further aspects, any of the disclosed above patterns can be filled with any of the disclosed above materials. It can be done by any known in the art methods, for example, metal deposition, sputtering, plasma, chemical vapor deposition, atomic layer deposition, e-beam deposition, electrocoating, spraying, dipping, and the like.

In still further aspects disclosed methods also comprise mixing a $B_2O_3$ and $SiO_2$ to form a first mixture comprising $xB_2O_3$-$(100-x)SiO_2$, wherein x is greater than 10 mol % and less than 100 mol %, mixing the first mixture with one or more of aluminum oxide, aluminum nitride, silicon carbide, silicon nitride, or silicate minerals to form a second mixture; forming a glass-bonded ceramic.

In still further aspects, a method can comprise (a) forming a first mixture comprising $xB_2O_3$-$ySiO_2$-$zM_2O$, wherein $10 \leq x < 100$ by mol %, wherein $0 < y < 90$ by mol %; wherein M is an alkali metal and wherein $0 \leq z \leq 10$ by mol %; (b) mixing the first mixture with one or more of aluminum oxide, aluminum nitride, silicon carbide, silicon nitride, or silicate minerals to form a second mixture; and (c) forming a glass-bonded ceramic.

In such aspects, x, y, and z can have any of the disclosed above values.

In still further aspects, the glass ceramic substrates can be made by any known in the art methods. For example, and without limitations, the glass ceramic substrates can be made by a tape casting process with a final sintering step to melt the glass and form a pore-free substrate. In still further aspects, the glass ceramic substrates can be sintered at temperatures of 800° C. to 1000° C., including exemplary values of 810° C., 820° C., 830° C., 840° C., 850° C., 860° C., 870° C., 880° C., 890° C., 900° C., 910° C., 920° C., 930° C., 940° C., 950° C., 960° C., 970° C., 980° C., and 990° C. It is further understood that the sintering temperature can be any temperature that falls between any two foregoing values or falls in a range formed by any two foregoing values. For example and without limitations, the sintering temperature can be 800° C. to 1000° C., 800° C. to 950° C., 800° C. to 900° C., 800° C. to 850° C., 850° C. to 1000° C., 900° C. to 1000° C., 950° C. to 1000° C., and so on.

In still further aspects, the methods disclosed herein comprise a step of forming a glass article or a glass substrate. Any known in the art methods of forming or shaping an article or substrate can be utilized. For example, and without limitation, the methods can comprise down drawing (by either a slot draw or fusion draw process), fiber-drawing, float or flat processing, or thin rolling of the glass. In yet other aspects, the methods can comprise shaping the glass to any desired shape. Various shaping methods can also be used, such as casting, molding, pressing, rolling, drawing, floating, and the like. In yet further aspects, the articles disclosed herein can be formed by a float/flat glass press process, a press-and-blow process, a blow-and-blow process, a waterfall process, a casting process, a slot draw, or any combination thereof.

EXAMPLES

The following examples are put forth so as to provide those of ordinary skill in the art with a complete disclosure and description of how the compounds, compositions, articles, devices, and/or methods claimed herein are made and evaluated and are intended to be purely exemplary and are not intended to limit the disclosure. Efforts have been made to ensure accuracy with respect to numbers (e.g., amounts, temperature, etc.), but some errors and deviations should be accounted for.

Example 1

A range of compositions, $xB_2O_3$-$(100-x)SiO_2$ where $33\% < x < 100\%$, were prepared by manually mixing the oxide constituents. The mix was calcined in the furnace for 1.5 hours at 200° C. to remove excess water. After calcining, approximately 60 g batches were melted in a platinum crucible at 1600° C. in a drop-down furnace for 3 hours, and the molten liquid was poured on a metal plate where the glass took several minutes to cool at room temperature.

Example 2

To obtain the dielectric properties of the samples, several characterization techniques have been employed to span the frequency range from 5 GHz to 3 THz: split cavity, the material characterization kit (MCK) from SWISSto12, and THz-TDS.

Figure 1B:
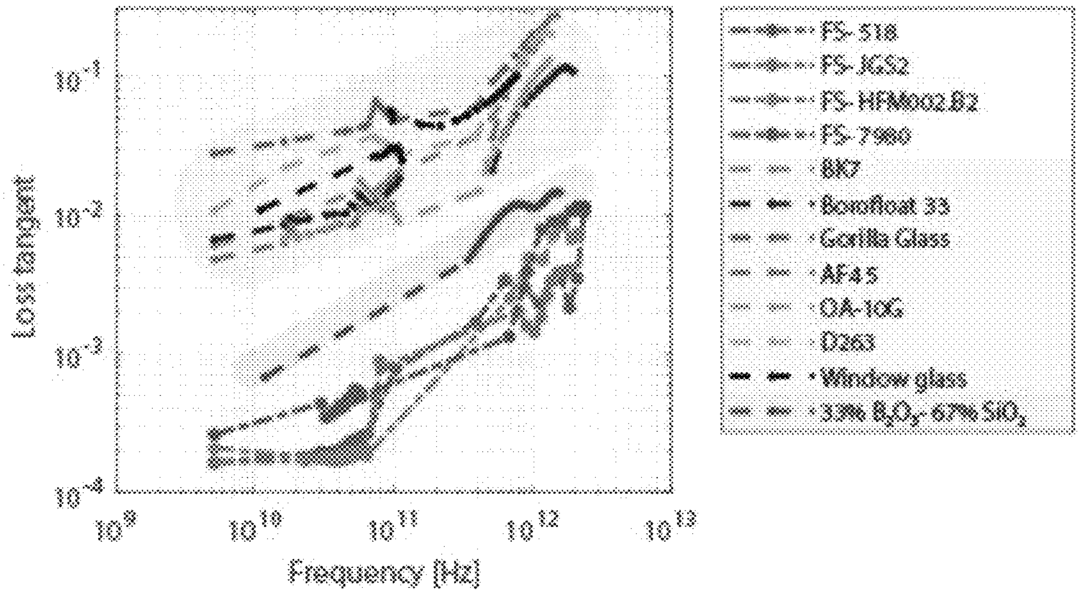

The dielectric properties of the fabricated samples have been plotted in FIG. 1A and compared with some other materials in the silicate family. The fabricated borosilicate sample has the lowest dielectric constant and loss (FIG. 1B) than any other glass (shadowed in blue). Its dielectric constant is even lower than any of the fused silicas (marked in yellow).

The molecular structure of glass has a strong effect on its polarizability, which is correlated with the dielectric constant and loss through the Clausius-Mossotti relationship. Clausius-Mossotti Relation Link dielectric permittivity with ionic polarizability.

$$\frac{\epsilon_r - 1}{\epsilon_r + 2} = \frac{4\pi N \alpha_V}{3}$$

$\varepsilon_r = \varepsilon/\varepsilon_0$ is the relative permittivity of the material; co is the free-space permittivity (units F/m); N is the number density of molecules per volume (units of $\text{Å}^{-3}$) and relates to density; and a is the molecular polarizability ($\text{Å}^3$) and relates to ion motion and charge.

The addition of modifiers (alkali and alkaline-earth elements) to silica produces depolymerization of the silicate network, and the polarizability increases. Mixtures of network formers (Si, Al, and B) result in heterogeneous linkages between the cations in the tetrahedral network, resulting in higher polarizability than that of a network comprised of one element.

Table 1 shows an increase in the cation-oxygen polarizability of pairs for all glass structures as compared with their crystalline counterparts. The polarizability difference for single-component glasses (i.e., pure $B_2O_3$ and $SiO_2$) is the smallest of any glass system. Alkaline and alkaline earth elements show the highest increase in polarization as the ionic environment changes from a glass to a crystalline structure. The dielectric loss is proportional to the increase in ionic polarizability as the structure transitions from crystalline to amorphous. Silica and boron oxide have the smallest change in polarizability (row 3 of Table 1), and mixtures of these glass phases provide the lowest dielectric loss material.

Based on Table 1, boron is the most promising additive to silica because of its low polarizability increment and very low melting temperature (440° C.). Even though boron is a very promising material, the rapid hydration of $B_2O_3$ rich mixtures has set high boron content glasses in the background in the literature. It can be found as a component of many glasses. One of the commercial glasses with higher boron content is Pyrex, with 12.6% of $B_2O_3$ and 80.6% of $SiO_2$. Vycor is made of 4% of $B_2O_3$ and 96% of $SiO_2$. Vycor is the only commercially available glass with a dielectric constant slightly lower than that of pure fused silica. The reported dielectric constant of Vycor 7911 at 100 MHz is 3.8, with a dielectric loss tangent of $7.2\times10^{-4}$.

TABLE 1

Polarizability of glass structures compared to their crystalline counterparts.

| | $SiO_2$ | $Na_2O$ | $Al_2O_3$ | CaO | MgO | $B_2O_3$ |
|---|---|---|---|---|---|---|
| Polariz. crystal ($\text{Å}^3$) | 4.89 | 5.6 | 3.82 | 5.17 | 3.33 | 6.13 |
| Polariz. glass ($\text{Å}^3$) | 5.89 | 8.8 | 5.49 | 14.75 | 11.71 | 6.43 |
| Polariz. increment (%) | 20.4 | 57.1 | 44.3 | 185.3 | 251.6 | 4.9 |

Several commercial glass compositions have been recently developed to minimize the dielectric loss at frequencies in the 5G range (Table 2). Loss values for commercial glass range between $10^{31\ 2}$ and $10^{-3}$, which are 3 to 10× higher than for the phase-separated glass that was developed in this invention.

TABLE 2

Dielectric properties of glasses designed for low loss at microwave frequency.

| Frequency | 10 GHz | |
|---|---|---|
| Glass type | $\varepsilon_r$ | tan δ |
| Microwave glass | 4.1 | 0.0017 |
| DURAN | 4.4 | 0.0061 |
| SHOTT 8325 | 4 | 0.0021 |
| 90% $B_2O_3$—10% $SiO_2$ [This work] | 2.98 | 0.00056 |

To confirm the immiscibility of the mixture, field emission scanning electron microscopy (FESEM) was done on fracture surfaces, which were sputter-coated with iridium to reduce the charging produced due to the non-conductive nature of the sample. Phase separation of boron and silica-rich regions is shown at the micron scale, and energy dispersive x-ray spectroscopy (EDS) measurements are shown in FIGS. 2A-2F. Carbon in the EDS measurement is from contamination in the SEM.

Example 3

A number of substrates having various B—Si compositions were constructed similar to Examples 1 and 2, and their dielectric properties and tangent loss are shown in Table 3. The 10-90 mol % Si—B glass sample has the lowest permittivity, even lower than the fused silicas. Having a glass material with a dielectric constant close to plastic will be advantageous from the mm-wave propagation perspective, as it will not affect that much the antenna performance.

TABLE 3

Dielectric constant and Loss tangent of various glass substrates

| Composition | Resonance frequency (GHz) | Dielectric Constant | Loss tangent |
|---|---|---|---|
| 33% $B_2O_3$—67% $SiO_2$ | 11.57 | 3.47 | 6.54e−4 |
| 50% $B_2O_3$—50% $SiO_2$ | 14.82 | 3.43 | 8.25e−4 |
| 60% $B_2O_3$—40% $SiO_2$ | 12.22 | 3.41 | 6.68e−4 |
| 67% $B_2O_3$—33% $SiO_2$ | 14.24 | 3.34 | 8.52e−4 |
| 80% $B_2O_3$—20% $SiO_2$ | 13.02 | 3.19 | 5.93e−4 |
| 90% $B_2O_3$—10% $SiO_2$ | 12.77 | 2.98 | 5.62e−4 |

The silicate family can be divided into three groups in terms of loss tangent: crystalline materials, fused silicas, and glasses. There is an order of magnitude difference among these groups. Low loss is important in mm-wave applications and the fact that the manufactured glass can reach a dielectric loss almost as low as the fused silicas makes it very surprising.

Highly polarizable cations increase permittivity and dielectric loss in the GHz-THz frequency range.

The polarizability difference between the amorphous and crystalline silica provides a clue to understanding the role of network formers and modifiers on dielectric loss. Alkali and alkaline earth modifiers increase Si—O polarizability. Alumina and niobia formers increase Si—O polarizability. The polarizability difference between modifier cations in the amorphous and crystalline states is correlated with dielectric loss.

Example 4

Six glasses were synthesized with a range of compositions $xB_2O_3$-$ySiO_2$-$zM_2O$, wherein a mole ratio of B to Si was kept at 1.

Bulk glass was prepared by manually mixing $B_2O_3$ and $SiO_2$ powders. 60-g batches were calcined at 200° C. for 1.5 hours to prevent foaming in the mix due to excess water. After the calcination, the batches were melted in a platinum-rhodium crucible at 1600° C. for 3 hours using a traditional drop-down furnace. To improve glass processability and durability from corrosion, additional samples with a small percentage of alkali added to the borosilicate glass were synthesized. Three different alkali percentages were evaluated: 2%, 5%, and 10%. The alkalis employed were lithium, sodium, and potassium. The relation between boron and silicon has been kept constant (50% B-50% Si, which corresponds to 33% mol $B_2O_3$-67% mol $SiO_2$). Unlike the borosilicates, which were quenched at room temperature, for the alkali-borosilicates, an additional step of annealing overnight at 200° C. was necessary.

(a) Characterization

The dielectric properties were measured using a split-cavity or resonant mode dielectrometer (RMD-C, GDK Product Inc.), where a $TE_{011}$ mode is excited. The densities of the samples were measured with a Mettler Toledo balance using the Archimedes principle. The surface morphology of several samples was explored using scanning electron microscopy (SEM, Verios G4). The fracture surfaces were coated with a 6 nm layer of iridium prior to imaging to reduce charging and improve the image quality.

The dielectric properties of unmodified borosilicates are detailed in Table 3 shown above. The compositions with higher boron amounts can yield a dielectric constant of 3 and a loss tangent of $5.6\times10^{-4}$, while the ones with less boron have a similar loss and a permittivity of 3.47. From all the commercial glasses, Vycor and SHOTT 8325 are the ones with lower loss, $7.2\times10^{-4}$ and $2.1\times10^{-3}$ and lower permittivity, 3.8 and 4, respectively. Fused silicas have lower loss tangents than the phase-separated borosilicate glasses, which, without wishing to be bound by theory, could be attributed to the boron oxide phase or interfaces between the boron and silica-rich regions. The measured loss tangent for fused silica JGS2 (is $1.6\times10^{-4}$, and the permittivity is 3.86. The proposed borosilicates have the advantage of lower cost than fused silicas, as they melt at lower temperatures. They count with lower dielectric constant and similar loss tangent.

Figure 2A:
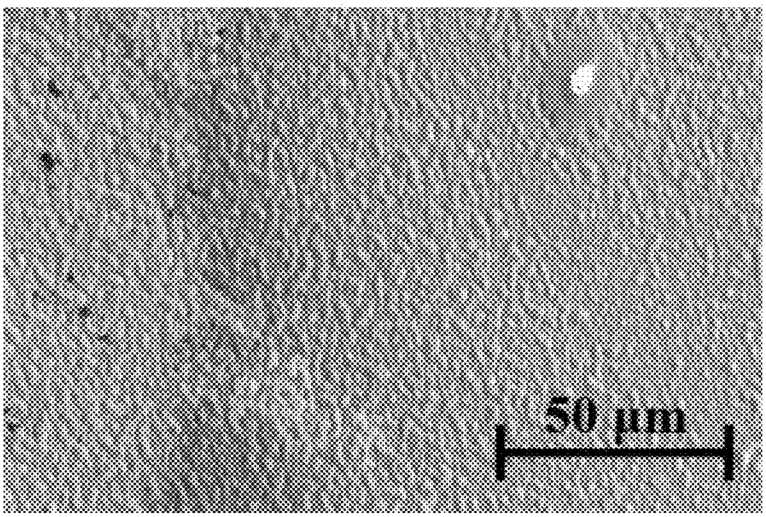
FIGS. 2A-2F show SEM and EDS micrographs of the exemplary glass structure of 33 mol % $B_2O_3$-67 mol % $SiO_2$.
Figure 2B:
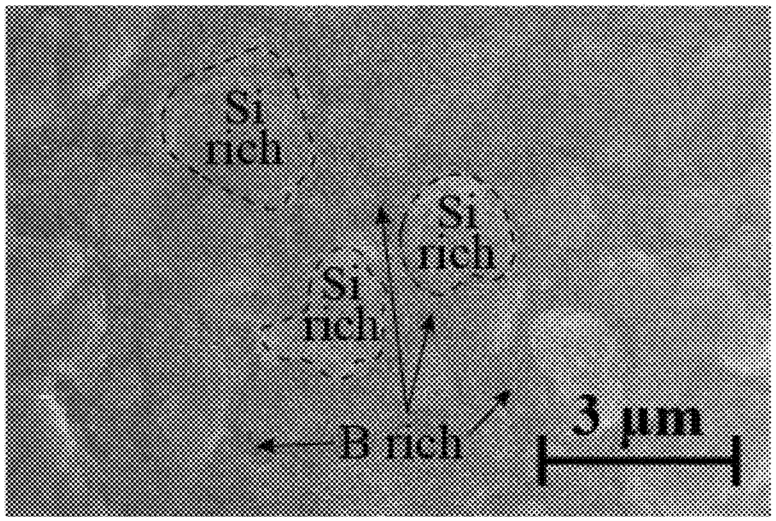
Figure 2C:
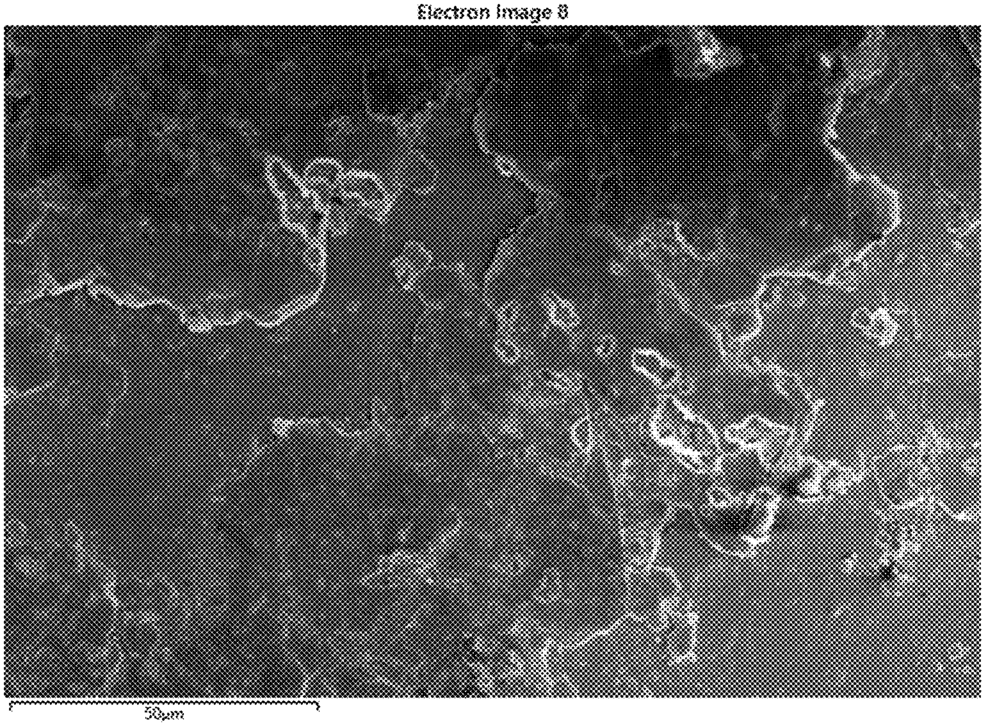
Figure 2D:
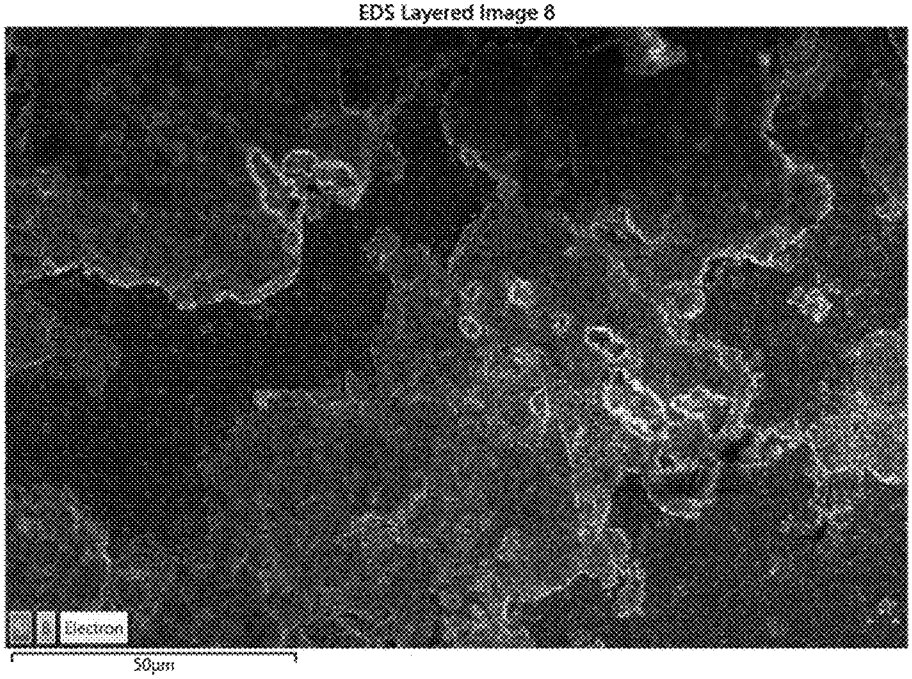
Figure 2E:
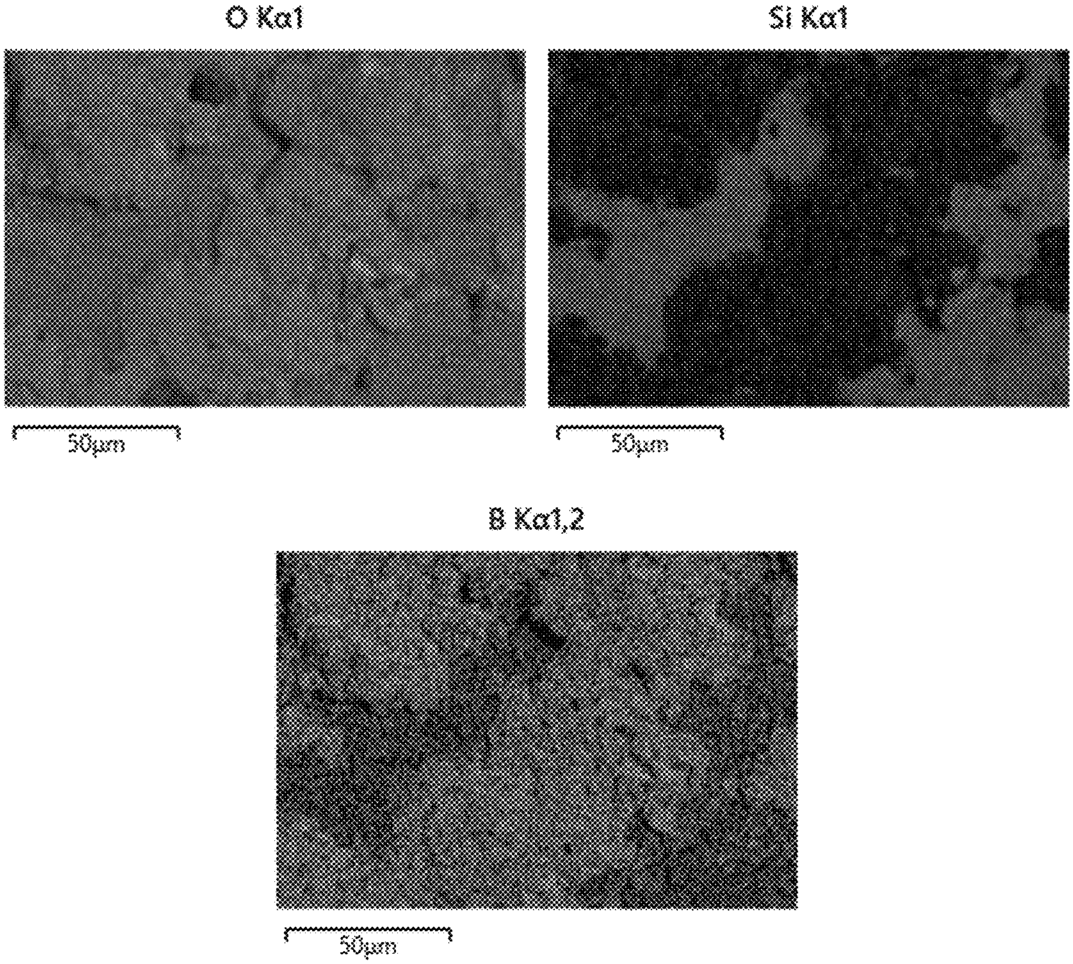
Figure 2F:
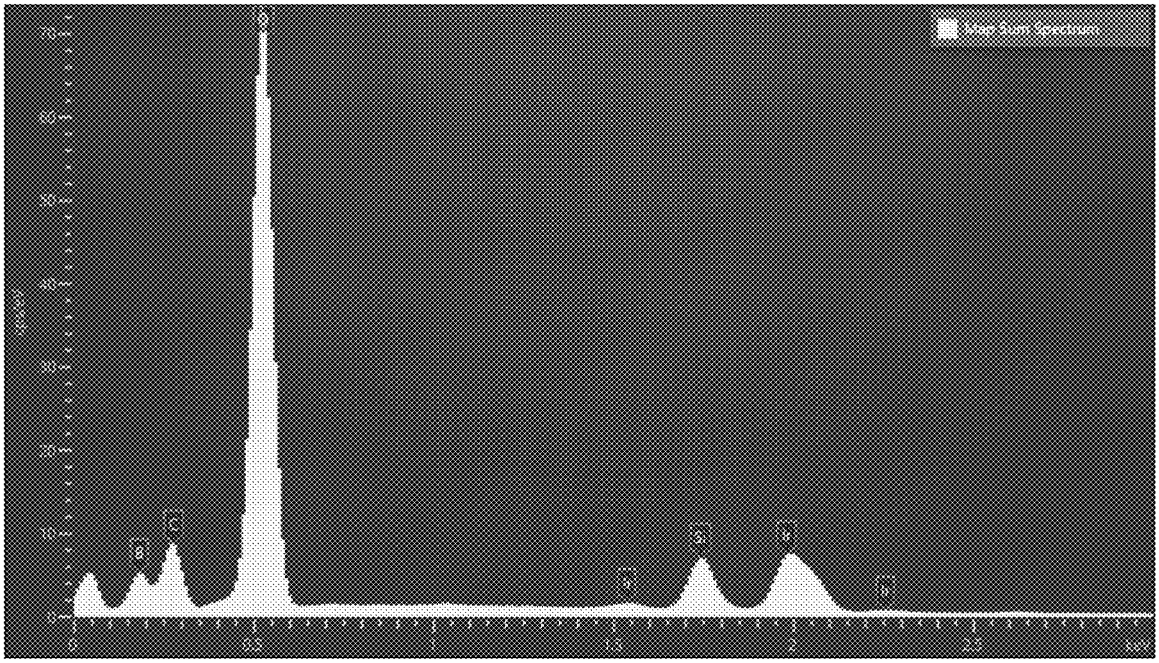

A representative scanning electron microscopy (SEM) micrograph of a fracture surface is shown in FIGS. 2A-2C. To confirm that the darker areas in the figure correspond to boron, surrounding silicon islands, FIG. 2D shows the (a) energy dispersive X-ray spectroscopy (EDS) map distinguishing both elements. The phase separation is a unique characteristic of this glass and probably the reason why a glass with this composition has not been pursued before for optical applications. From the electronics perspective, the wavelength size in the mm-wave spectrum is long enough (1 mm at 300 GHz) not to be affected by the silicon droplets. Furthermore, the immiscible borosilicate glass can be treated as a composite where effective medium theory applies to quantify the dielectric properties. To improve the processability and durability of this glass from hydration and corrosion, a small percentage of alkali has been added to the borosilicate glass. The relation between boron and silicon has been kept constant (50% B-50% Si, which corresponds to 33% $B_2O_3$-67% $SiO_2$). The dielectric properties of the different alkali borosilicate glasses can be found in Table 4. A 2% mol of alkali oxide provides close dielectric values to the original borosilicate glass. Even the change from 2% mol to 5% mol provides similar dielectric properties. When 10% mol of alkali oxide is added, then there is an order of magnitude change in the loss.

TABLE 4

Dielectric properties and density of the manufactured glasses.

| Name | Composition | Permittivity | Loss tangent | Density |
|---|---|---|---|---|
| BS | 33% $B_2O_3$—67% $SiO_2$ | 3.470 | $6.540\times10^{-4}$ | 2.046 |
| Li2BS | 2% $Li_2O$-32.34% $B_2O_3$—65.66% $SiO_2$ | 3.808 | $1.119\times10^{-3}$ | 2.076 |
| Li5BS | 5% $Li_2O$-31.35% $B_2O_3$—63.65% $SiO_2$ | 3.984 | $2.415\times10^{-3}$ | 2.094 |
| Li10BS | 10% $Li_2O$-29.7% $B_2O_3$—60.3% $SiO_2$ | 4.456 | $4.212\times10^{-3}$ | 2.170 |
| Na2BS | 2% $Na_2O$-32.34% $B_2O_3$—65.66% $SiO_2$ | 3.846 | $1.380\times10^{-3}$ | 2.053 |
| Na5BS | 5% $Na_2O$-31.35% $B_2O_3$—63.65% $SiO_2$ | 4.128 | $3.580\times10^{-3}$ | 2.113 |
| Na10BS | 10% $Na_2O$-29.7% $B_2O_3$—60.3% $SiO_2$ | 4.463 | $4.126\times10^{-3}$ | 2.168 |
| K2BS | 2% $K_2O$-32.34% $B_2O_3$—65.66% $SiO_2$ | 3.935 | $1.951\times10^{-3}$ | 2.064 |
| K5BS | 5% $K_2O$-31.35% $B_2O_3$—63.65% $SiO_2$ | 4.110 | $3.595\times10^{-3}$ | 2.110 |
| K10BS | 10% $K_2O$-29.7% $B_2O_3$—60.3% $SiO_2$ | 4.487 | $6.691\times10^{-3}$ | 2.167 |

Figure 4:
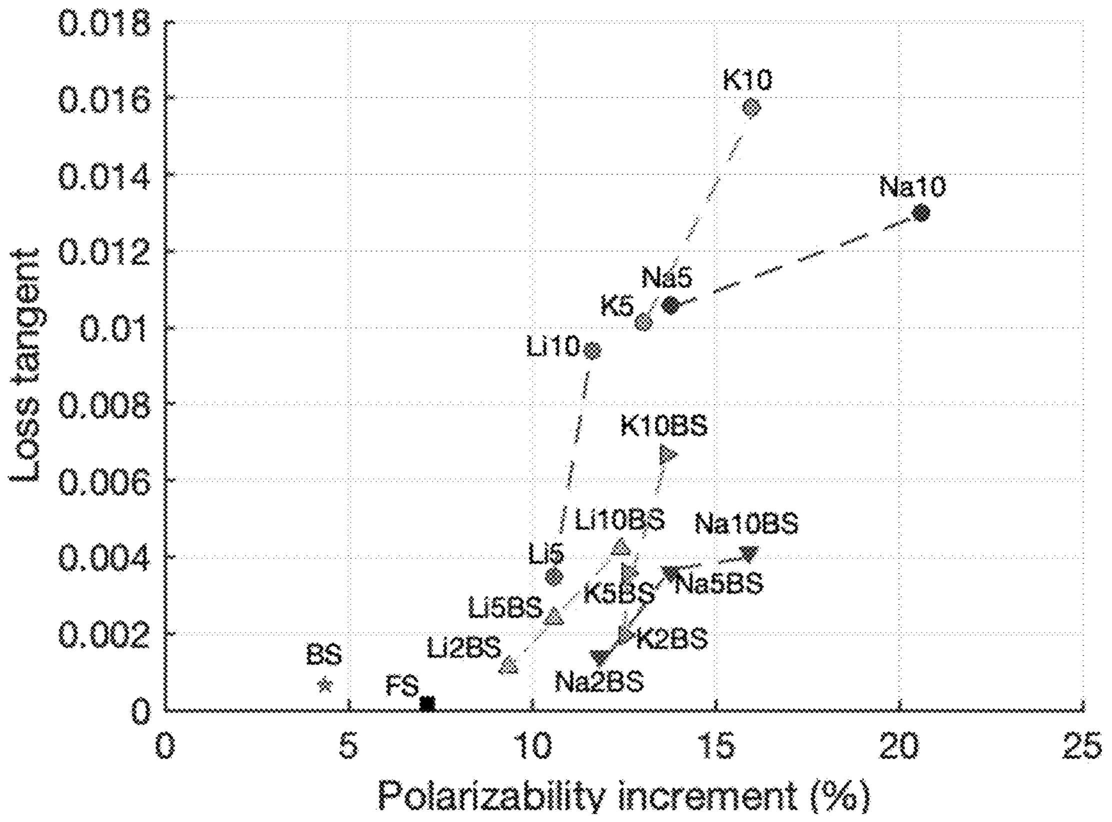
FIG. 4 depicts a dielectric loss tangent as a function of the polarizability increment of the glassy state compared to the crystalline one.

A new metric to assess the loss of a compound in terms of polarizability was proposed. The polarizability increment was defined as the percentage rise in polarizability from crystalline to amorphous. For each composition, it is necessary to calculate the polarizability as if the compound provided a crystalline material and the polarizability of the resulting glass. For the crystalline part, the polarizabilities of all the ions are added together. In the amorphous case, the dielectric properties and the density need to be measured. Then, Equation (1) allows to obtain polarizability. The polarizability increment, Aa, can be calculated as $$\Delta\alpha = \frac{\alpha_G - \alpha_X}{\alpha_X} \cdot 100$$

where $\alpha_G$ is the polarizability of the glass, and $\alpha_X$ is the polarizability of the crystalline counterpart. FIG. 4 shows the loss tangent as a function of the glass polarizability increment from crystalline to glassy state. In the study, single alkalisilicates have also been added for comparison, and they are labeled as [Li, Na, K]z, with z being the alkali oxide mol percentage. Several commercial glasses have also been included: AF45, OA10G, BK7, and Borofloat 33 (BF33). From FIG. 4, it is possible to see that the borosilicate composition labeled as BS (33% $B_2O_3$-67% $SiO_2$) has a polarizability increment smaller than fused silica, which explains why its loss tangent is so low. Adding a small percentage of alkali to the borosilicate glass increases the polarizability by around 5%, but it does not increase the loss tangent considerably. There is a linear trend between polarizability increment and loss tangent. An interesting fact from the plot is that the alkali borosilicate families with alkali modifiers have lower losses than their alkali silicate counterparts despite having similar polarizability in some cases. It is possible that the alkali ions are concentrated in the boron-rich phase of the glass.

The dielectric loss values shown in FIG. 4 are for single-phase pure fused silica and immiscible multiphase borosilicate glass systems. Since the phase distribution and volume of each phase in the immiscible microstructures are significantly smaller than the electromagnetic wavelength, the dielectric properties can be averaged according to effective medium theory. In this instance, the increase in polarizability is a result of the specific surroundings of each cation within the glass structure, irrespective of the specific cation present in each individual phase.

The combination of silicon oxide and boron oxide results in a phase-separated microstructure that exhibits a significantly lower dielectric constant and loss compared to any commercially available glasses within the mm-wave to THz frequency range. The confirmation of immiscibility through X-ray spectroscopy further solidifies the innovative contributions of this research. The implications of these findings extend beyond theoretical considerations, offering a promising avenue for the development of advanced materials with enhanced dielectric properties for packaging applications in the chips for the new generations of communications. A new metric has been proposed to relate the dielectric properties to the material internal structure, which helps develop low loss materials.

In view of the described processes and compositions, hereinbelow are described certain more particularly described aspects of the inventions. However, these particularly recited aspects should not be interpreted to have any limiting effect on any different claims containing different or more general teachings described herein or that the "particular" aspects are somehow limited in some way other than the inherent meanings of the language and formulas literally used therein.

REFERENCES

L. Wang, J. Yang, W. Cheng, J. Zou and D. Zhao,»Progress on polymer composites with low dielectric constant and low dielectric loss for high-frequency signal transmission,«*Frontiers in Materials*, p. 434, 2021.

C.-C. Cho, D. M. Smith and J. Anderson,»Low dielectric-constant insulators for electronics applications,«*Materials chemistry and physics*, vol . . . 42, p. 91-95, 1995.

T. Yu, X. Ren, D. Yu, X. Zhang and F. Jiang,»Developing of wafer level fan-out packaging technology for millimeter-wave chip using different carriers, in 2019 *IEEE International Conference on Integrated Circuits, Technologies and Applications* (*ICTA*), 2019.

A. Shorey, S. Pollard, A. Streltsov, G. Piech and R. Wagner, »Development of substrates for through glass vias (TGV) for 3DS-IC integration,«in 2012 *IEEE 62nd Electronic Components and Technology Conference,* 2012.

D. H. Levy, S. F. Nelson, A. B. Shorey and P. Balentine, »Enabling low loss thin glass solutions for 5G/mmWave applications,«in 2021 *IEEE 71st Electronic Components and Technology Conference* (*ECTC*), 2021.

S. Sivapurapu, R. Chen, M. ur Rehman, K. Kanno, T. Kakutani, M. Letz, F. Liu, S. K. Sitaraman and M. Swaminathan,»Flexible and ultra-thin glass substrates for RF applications,«in 2021 *IEEE 71st Electronic Components and Technology Conference* (*ECTC*), 2021.

N. J. Tostanoski, D. Möncke, R. Youngman and S. K. Sundaram,»Structure-terahertz property relationship in sodium borosilicate glasses,«*International Journal of Applied Glass Science*, vol. 14, p. 288-306, 2023.

M. T. Lanagan, L. Cai, L. A. Lamberson, J. Wu, E. Streltsova and N. J. Smith,»Dielectric polarizability of alkali and alkaline-earth modified silicate glasses at microwave frequency,«*Applied Physics Letters*, vol. 116, p. 222902, 2020.

R. D. Shannon,»Dielectric polarizabilities of ions in oxides and fluorides,«*Journal of Applied physics*, vol. 73, p. 348-366, 1993.

R. J. Charles and F. E. Wagstaff, "Metastable immiscibility in the $B_2O_3$—$SiO_2$ system," *Journal of the American Ceramic Society*, vol. 51, p. 16-20, 1968.

R. Rodriguez-Cano, S. E. Perini, B. M. Foley and M. Lanagan,»Broadband Characterization of Silicate Materials for Potential 5G/6G Applications,«*IEEE Transactions on Instrumentation and Measurement*, vol. 72, pp. 1-8, 2023.

L. G. Van Uitert, D. A. Pinnow, J. C. Williams, T. C. Rich, R. E. Jaeger and W. H. Grodkiewicz,»Borosilicate glasses for fiber optical waveguides,«*Materials Research Bulletin*, vol. 8, p. 469-476, 1973.

L. Cai, J. Wu, L. Lamberson, E. Streltsova, C. Daly, A. Zakharian and N. F. Borrelli, "Glass for 5G applications," *Applied Physics Letters*, vol. 119, p. 082901, 2021.

I. SHOTT, *Glass Antennas for High-Frequency Applications,* 2023.

M. Letz, H. Engelmann, G. Lautenschläger, N. Brune, X. Bai, B. Salski and T. Karpisz,»Special glass for packaging of high frequency electronics,«in 2021 *51st European Microwave Conference* (*EuMC*), IEEE, 2022, pp. 103-106.

Y. Xing and T. S. Rappaport,»Propagation measurement system and approach at 140 GHz-moving to 6G and above 100 GHZ,«in 2018 *IEEE global communications Conference* (*GLOBECOM*), 2018.

K. Wakino, M. Murata and H. Tamura,»Far infrared reflection spectra of Ba (Zn, Ta) O3-BaZrO3 dielectric resonator material,«*Journal of the American Ceramic Society*, vol. 69, p. 34-37, 1986.

J. Sheen,»Study of microwave dielectric properties measurements by various resonance techniques,«*Measurement*, vol. 37, p. 123-130, 2005.

M. T. Lanagan, T. Brown, S. Perini and Q. X. Yang,»High frequency dielectric materials for medicine and telecommunications,«*Japanese Journal of Applied Physics*, vol. 60, p. SF0801, 2021.

F. Kremer and A. Schönhals, Broadband dielectric spectroscopy, Springer Science & Business Media, 2002.

M. Swaminathan, M. Kathaperumal, K.-s. Moon, H. Sharma, P. Murali, S. Ravichandran, Materials for heterogeneous integration, MRS Bulletin 46 (10) (2021) 967-977.

S. Ravichandran, K.-Q. Huang, M. ur Rehman, S. Erdogan, A. Watanabe, N. Nedumthakady, F. Liu, M. Kathaperumal, M. Swaminathan, Packaging approaches for mm wave and sub-thz communication, in: 2019 IEEE MTT-S International Microwave Conference on Hardware and Systems for 5G and Beyond (IMC-5G), IEEE, 2019, pp. 1-5.

X. Jia, X. Li, K.-S. Moon, M. Swaminathan, Die-embedded glass packaging for 6 g wireless applications, MRS Advances 7 (29) (2022) 630-634.

M. T. Lanagan, L. Cai, L. A. Lamberson, J. Wu, E. Streltsova, N. J. Smith, Dielectric polarizability of alkali and alkaline-earth modified silicate glasses at microwave frequency, Applied Physics Letters 116 (22) (2020) 222902.

R. D. Shannon, Dielectric polarizabilities of ions in oxides and fluorides, Journal of Applied physics 73 (1) (1993) 348-366.

M. E. Nordberg, Properties of some vycor-brand glasses, Journal of the American Ceramic Society 27 (10) (1944) 299-305.

Exemplary Aspects

Example 1: A device comprising: a glass substrate comprising a glass structure comprising $xB_2O_3$-(100-x)$SiO_2$, wherein x is greater than 10 mol % and less than 100 mol %, wherein the glass structure comprises two or more immiscible phases, wherein the glass substrate has a dielectric constant lower than 6, and wherein the glass substrate has a dielectric loss tangent equal to or less than $1\times10^{-2}$ in a frequency range from 1 GHz to 1 THz.

Example 2: The device of any examples herein, particularly example 1, wherein x is greater than or equal to 33 mol % to less than 100 mol %.

Example 3: The device of any examples herein, particularly example 1 or 2, wherein the glass structure is substantially free of porosity.

Example 4: The device of any examples herein, particularly examples 1-3, wherein the glass substrate has a dielectric constant lower than 4.5.

Example 5: The device of any examples herein, particularly examples 1-4, wherein the glass substrate has a dielectric loss tangent of $1\times10^{-4}$ to $3\times10^{-3}$ in a frequency range from 1 GHz to 200 GHz.

Example 6: The device of any examples herein, particularly examples 1-5, wherein the glass substrate has a coefficient of thermal expansion of 5 to 15 ppm/° C.

Example 7: The device of any examples herein, particularly examples 1-6, wherein a first phase of the two or more phases has a first permittivity higher than a second permittivity of a second phase of the two or more phases.

Example 8: The device of any examples herein, particularly examples 1-7, wherein the two or more phases at least partially penetrate each other.

Example 9: The device of any examples herein, particularly examples 1-8, wherein one of the two or more phases forms a core surrounded by a second of the two or more phases.

Example 10: The device of any examples herein, particularly examples 1-9, wherein at least one of the two or more phases is present as one or more droplets.

Example 11: The device of any examples herein, particularly example 10, wherein the at least one of the two or more phases forms one or more aggregates comprising the one or more droplets.

Example 12: The device of any examples herein, particularly examples 1-11, wherein the glass structure further comprises one or more glass-forming components and/or modifiers in an amount of less than 1000 ppm.

Example 13: The device of any examples herein, particularly example 12, wherein the one or more glass-forming components and/or modifiers comprise aluminum oxide, barium oxide, calcium oxide, sodium oxide, or potassium oxide.

Example 14: The device of any examples herein, particularly examples 1-13, wherein the glass structure is substantially free of a crystalline phase.

Example 15: The device of any examples herein, particularly examples 1-14, wherein the glass substrate is patterned to form one or more pathways for integration of one or more predetermined components.

Example 16: The device of any examples herein, particularly example 15, wherein the glass substrate is patterned to form one or more vias, wherein the one or more vias extend at least through a portion of a glass substrate thickness.

Example 17: The device of any examples herein, particularly example 16, wherein the one or more vias extend through the glass substrate thickness.

Example 18: The device of any examples herein, particularly examples 14-17, wherein the glass substrate is patterned to form one or more channels on at least one surface of the glass substrate.

Example 19: The device of any examples herein, particularly example 18, wherein the one or more channels at least partially extend into a thickness of the glass substrate.

Example 20: The device of any examples herein, particularly examples 1-19, wherein the glass substrate has a coating disposed on at least one surface of the glass substrate.

Example 21: The device of any examples herein, particularly example 20, wherein the coating is disposed in a predetermined pattern.

Example 22: The device of any examples herein, particularly example 20 or 21, wherein the coating comprises a metal, a metal alloy, a metal composite, a ceramic, a dielectric, a polymer, or a combination thereof.

Example 23: The device of any examples herein, particularly examples 15-22, wherein the one or more vias comprise a metal, a metal alloy, a metal composite, a ceramic, a dielectric, a polymer, or a combination thereof.

Example 24: The device of any examples herein, particularly examples 18-23, wherein the one or more channels comprise a metal, a metal alloy, a metal composite, a ceramic, a dielectric, a polymer, or a combination thereof.

Example 25: The device of any examples herein, particularly examples 1-24, wherein the glass substrate has a predetermined shape.

Example 26: The device of any examples herein, particularly examples 1-25, wherein the glass substrate has a thickness of 500 nm to 3 cm.

Example 27: The device of any examples herein, particularly examples 15-26, wherein the device comprises a discrete component, an integrated passive device, an antenna, an RF bridge, a diode sub-mount, a fiber alignment, a filter, a resonator, a capacitor, an inductor, a resistor, a substrate integrated waveguide device, an interposer, an electronic packaging, a semiconductor, microprocessor, mm-wave integrated circuit, metasurface, or any combination thereof.

Example 28: A glass-bonded ceramic comprising a glass comprising $xB_2O_3$-(100-x)$SiO_2$, wherein x is greater than 10 mol % and less than 100 mol %, one or more of aluminum oxide, aluminum nitride, silicon carbide, silicon nitride, or silicate minerals, and wherein the glass-bonded ceramic has a dielectric loss tangent equal to or less than $1\times10^{-2}$ in a frequency range from 1 GHz to 1 THz.

Example 29: An article comprising the glass-bonded ceramic of any examples herein, particularly example 28.

Example 30: The article of any examples herein, particularly example 29, wherein the article comprises a discrete component, an integrated passive device, an antenna, an RF bridge, a diode sub-mount, a fiber alignment, a filter, a resonator, a capacitor, an inductor, a resistor, a substrate integrated waveguide device, an interposer, an electronic packaging, a semiconductor, microprocessor, mm-wave integrated circuit, metasurface, or any combination thereof.

Example 31: A method of forming a device of any examples herein, particularly examples 1-27, comprising mixing a $B_2O_3$ and $SiO_2$ to form a mixture comprising $xB_2O_3$_(100-x)$SiO_2$, wherein x is greater than 10 mol % and less than 100 mol %, melting the mixture to form a molten liquid, and cooling the molten liquid to form a glass substrate.

Example 32: The method of forming a device of any examples herein, particularly example 31, further comprising a step of calcining the mixture prior to the step of melting.

Example 33: The method of forming a device of any examples herein, particularly example 32, wherein the step of calcining is performed at a temperature of 150° C. to 250° C. for a predetermined time.

Example 34: The method of forming a device of any examples herein, particularly examples 31-33, wherein the step of melting is performed at a temperature of 1400° C. to 1650° C.

Example 35: The method of forming a device of any examples herein, particularly examples 31-34, further comprising patterning the glass substrate to form one or more pathways for integration of one or more predetermined components.

Example 36: A method comprising: mixing a $B_2O_3$ and $SiO_2$ to form a first mixture comprising $xB_2O_3$-(100-x)$SiO_2$, wherein x is greater than 10 mol % and less than 100 mol %, mixing the first mixture with one or more of aluminum oxide, aluminum nitride, silicon carbide, silicon nitride, or silicate minerals to form a second mixture; forming a glass-bonded ceramic.

Example 37: A device comprising: a glass substrate comprising a glass composition comprising $xB_2O_3$-$ySiO_2$-$zM_2O$, wherein $10 \leq x < 100$ by mol %; wherein $0 < y < 90$ by mol %; wherein M is an alkali metal and wherein $0 \leq z \leq 10$ by mol %, wherein the glass forms a structure comprising two or more immiscible phases, wherein the glass substrate has a dielectric constant lower than 6, and wherein the glass substrate has a dielectric loss tangent equal to or less than $1\times10^{-2}$ in a frequency range from 1 GHz to 1 THz; and wherein the glass structure is substantially free of porosity.

Example 38. The device of any examples herein, particularly example 37, wherein M is Li, Na, K, or a combination thereof.

Example 39. The device of any examples herein, particularly example 37, wherein $25 < x < 100$ by mol %.

Example 40. The device of any examples herein, particularly example 37, wherein a molar ratio of B to Si is 1:1.

Example 41. The device of any examples herein, particularly example 37, wherein a molar ratio of B to Si is greater than 1.

Example 42. The device of any examples herein, particularly example 37, wherein the glass substrate has a dielectric constant lower than 4.5 and a dielectric loss tangent of $1\times10^{-4}$ to $3\times10^{-3}$ in a frequency range from 1 GHz to 200 GHz.

Example 43. The device of any examples herein, particularly example 37, wherein the glass substrate has a coefficient of thermal expansion of 5 to 15 ppm/° C.

Example 44. The device of any examples herein, particularly example 37, wherein a first phase of the two or more phases has a first permittivity higher than a second permittivity of a second phase of the two or more phases.

Example 45. The device of any examples herein, particularly example 37, wherein i) the two or more phases at least partially penetrate each other; and/or ii) one of the two or more phases forms a core surrounded by a second of the two or more phases; and/or iii) at least one of the two or more phases is present as one or more droplets.

Example 46. The device of any examples herein, particularly example 45, wherein when the at least one of the two or more phases is present as one or more droplets, the at least one of the two or more phases forms one or more aggregates comprising the one or more droplets.

Example 47. The device of any examples herein, particularly example 46, wherein the glass structure further comprises one or more glass-forming components and/or modifiers in an amount of less than 1000 ppm.

Example 48. The device of any examples herein, particularly example 47, wherein the one or more glass-forming components and/or modifiers comprise aluminum oxide, barium oxide, calcium oxide, or a combination thereof.

Example 49. The device of any examples herein, particularly example 37, wherein the glass structure is substantially free of a crystalline phase.

Example 50. The device of any examples herein, particularly example 37, wherein the glass substrate is patterned to form one or more pathways for integration of one or more predetermined components.

Example 51. The device of any examples herein, particularly example 50, wherein the glass substrate is patterned: i) to form one or more vias, wherein the one or more vias extend at least through a portion of a glass substrate thickness; and/or ii) to form one or more channels on at least one surface of the glass substrate.

Example 52. The device of any examples herein, particularly example 51, wherein i) when the one or more vias are present, the one or more vias extend through the glass substrate thickness; and/or ii) when the one or more channels are present, the one or more channels at least partially extend into a thickness of the glass substrate.

Example 53. The device of any examples herein, particularly example 37, wherein the glass substrate has a coating disposed on at least one surface of the glass substrate, and wherein the coating comprises a metal, a metal alloy, a metal composite, a ceramic, a dielectric, a polymer, or a combination thereof.

Example 54. The device of any examples herein, particularly example 37, wherein the device comprises a discrete component, an integrated passive device, an antenna, an RF bridge, a diode sub-mount, a fiber alignment, a filter, a resonator, a capacitor, an inductor, a resistor, a substrate integrated waveguide device, an interposer, an electronic packaging, a semiconductor, microprocessor, mm-wave integrated circuit, metasurface, or any combination thereof.

Example 55. A glass-bonded ceramic comprising: a glass composition comprising $xB_2O_3$-$ySiO_2$-$zM_2O$, wherein $10 \leq x < 100$ by mol %; wherein $0 < y < 90$ by mol %; wherein M is an alkali metal and wherein $0 \leq z \leq 10$ by mol %, and one or more of aluminum oxide, aluminum nitride, silicon carbide, silicon nitride, or silicate minerals, wherein the glass-bonded ceramic has a dielectric loss tangent equal to or less than $1\times10^{-2}$ in a frequency range from 1 GHz to 1 THz.

Example 56. An article comprising the glass-bonded ceramic of any examples herein, particularly example 54, wherein the article comprises a discrete component, an integrated passive device, an antenna, an RF bridge, a diode sub-mount, a fiber alignment, a filter, a resonator, a capacitor, an inductor, a resistor, a substrate integrated waveguide device, an interposer, an electronic packaging, a semiconductor, microprocessor, mm-wave integrated circuit, metasurface, or any combination thereof.

Example 57. A method of forming a device of any examples herein, particularly example 37, comprising: (a) forming a mixture comprising $xB_2O_3$-$ySiO_2$-$zM_2O$, wherein $10\leq x<100$ by mol % wherein $0<y<90$ by mol %; wherein M is an alkali metal and wherein $0\leq z\leq 10$ by mol % (b) melting the mixture to form a molten liquid, and cooling the molten liquid to form a glass substrate.

Example 58. The method of any examples herein, particularly example 57, further comprising a step of calcining the mixture prior to the step of melting at a temperature of 150° C. to 250° C. for a predetermined time.

Example 59. The method of any examples herein, particularly example 57, wherein the step of melting is performed at a temperature of 1400° C. to 1650° C.

Example 60. A method comprising: (a) forming a first mixture comprising $xB_2O_3$-$ySiO_2$-$zM_2O$, wherein $10\leq x<100$ by mol %, wherein $0<y<90$ by mol %; wherein M is an alkali metal and wherein $0\leq z\leq 10$ by mol %; (b) mixing the first mixture with one or more of aluminum oxide, aluminum nitride, silicon carbide, silicon nitride, or silicate minerals to form a second mixture; and (c) forming a glass-bonded ceramic.

What is claimed is:

1. A device comprising:

a glass substrate comprising a glass composition comprising $xB_2O_3$-$ySiO_2$-$zM_2O$, wherein $10\leq x<100$ by mol %;

wherein $0<y<90$ by mol %;

wherein M is an alkali metal and wherein $0\leq z\leq 10$ by mol %, wherein the glass composition forms a glass structure comprising two or more immiscible phases, wherein the glass substrate has a dielectric constant lower than 6, and wherein the glass substrate has a dielectric loss tangent equal to or less than $1\times10^{-2}$ in a frequency range from 1 GHz to 1 THz; and wherein the glass structure is substantially free of porosity.

2. The device of claim 1, wherein M is Li, Na, K, or a combination thereof.

3. The device of claim 1, wherein $25<x<100$ by mol %.

4. The device of claim 1, wherein a molar ratio of B to Si is:

i) 1:1 or ii) is greater than 1.

5. The device of claim 1, wherein the glass substrate has a dielectric constant lower than 4.5 and a dielectric loss tangent of $1\times10^{-4}$ to $3\times10^{-3}$ in a frequency range from 1 GHz to 200 GHz.

6. The device of claim 1, wherein the glass substrate has a coefficient of thermal expansion of 5 to 15 ppm/° C.

7. The device of claim 1, wherein a first phase of the two or more phases has a first permittivity higher than a second permittivity of a second phase of the two or more phases.

8. The device of claim 1, wherein i) the two or more phases at least partially penetrate each other; and/or ii) one of the two or more phases forms a core surrounded by a second of the two or more phases; and/or iii) at least one of the two or more phases is present as one or more droplets.

9. The device of claim 8, wherein when the at least one of the two or more phases is present as one or more droplets, the at least one of the two or more phases forms one or more aggregates comprising the one or more droplets.

10. The device of claim 9, wherein the glass structure further comprises one or more glass-forming components and/or modifiers in an amount of less than 1000 ppm.

11. The device of claim 10, wherein the one or more glass-forming components and/or modifiers comprise aluminum oxide, barium oxide, calcium oxide, or a combination thereof.

12. The device of claim 1, wherein the glass structure is substantially free of a crystalline phase.

13. The device of claim 1, wherein the glass substrate is patterned:

i) to form one or more vias, wherein the one or more vias extend at least through a portion of a glass substrate thickness; and/or ii) to form one or more channels on at least one surface of the glass substrate.

14. The device of claim 13, wherein i) when the one or more vias are present, the one or more vias extend through the glass substrate thickness; and/or ii) when the one or more channels are present, the one or more channels at least partially extend into a thickness of the glass substrate.

15. The device of claim 1, wherein the glass substrate has a coating disposed on at least one surface of the glass substrate, and wherein the coating comprises a metal, a metal alloy, a metal composite, a ceramic, a dielectric, a polymer, or a combination thereof.

16. The device of claim 1, wherein the device comprises a discrete component, an integrated passive device, an antenna, an RF bridge, a diode sub-mount, a fiber alignment, a filter, a resonator, a capacitor, an inductor, a resistor, a substrate integrated waveguide device, an interposer, an electronic packaging, a semiconductor, microprocessor, mm-wave integrated circuit, metasurface, or any combination thereof.

17. A method of forming a device of claim 1, comprising:

a) forming a mixture comprising $xB_2O_3$-$ySiO_2$-$zM_2O$, wherein $10\leq x<100$ by mol % wherein $0<y<90$ by mol %;

wherein M is an alkali metal and wherein $0\leq z\leq 10$ by mol % b) melting the mixture to form a molten liquid, and cooling the molten liquid to form a glass substrate.

18. The method of claim 17, further comprising a step of calcining the mixture prior to the step of melting at a temperature of 150° C. to 250° C. for a time period of 5 min to 5 hours.

19. The method of claim 17, wherein the step of melting is performed at a temperature of 1400° C. to 1650° C.

* * * * *